United States Patent
Siau

(10) Patent No.: US 9,007,810 B2
(45) Date of Patent: Apr. 14, 2015

(54) RERAM FORMING WITH RESET AND ILOAD COMPENSATION

(71) Applicant: SanDisk 3D LLC, Milpitas, CA (US)

(72) Inventor: Chang Siau, Saratoga, CA (US)

(73) Assignee: SanDisk 3D LLC, Milpitas, CA (US)

( * ) Notice: Subject to any disclaimer, the term of this patent is extended or adjusted under 35 U.S.C. 154(b) by 140 days.

(21) Appl. No.: 13/781,503

(22) Filed: Feb. 28, 2013

(65) Prior Publication Data

US 2014/0241035 A1    Aug. 28, 2014

(51) Int. Cl.
G11C 11/00 (2006.01)
G11C 13/00 (2006.01)
G11C 7/20 (2006.01)
G11C 29/02 (2006.01)

(52) U.S. Cl.
CPC .............. *G11C 13/0002* (2013.01); *G11C 7/20* (2013.01); *G11C 13/0064* (2013.01); *G11C 13/0069* (2013.01); *G11C 29/028* (2013.01); G11C 2013/0083 (2013.01); G11C 2013/0088 (2013.01)

(58) Field of Classification Search
CPC .......... G11C 13/0002; G11C 13/0004; G11C 29/028; G11C 29/50; G11C 13/0064
USPC ............... 365/148, 158, 163, 185.18, 185.22, 365/189.07
See application file for complete search history.

(56) References Cited

U.S. PATENT DOCUMENTS

| 7,187,228 | B1 | 3/2007 | Jain et al. |
| 7,345,907 | B2 | 3/2008 | Scheuerlein |
| 7,369,431 | B2 | 5/2008 | Muraoka et al. |
| 7,382,647 | B1 | 6/2008 | Gopalakrishnan |
| 7,426,128 | B2 | 9/2008 | Scheuerlein |
| 7,463,506 | B2 | 12/2008 | Muraoka et al. |
| 7,499,304 | B2 | 3/2009 | Scheuerlein et al. |
| 7,558,099 | B2 | 7/2009 | Morimoto |
| 7,791,923 | B2 | 9/2010 | Baek et al. |
| 7,826,248 | B2 | 11/2010 | Xi et al. |
| 7,869,258 | B2 | 1/2011 | Scheuerlein et al. |
| 7,920,407 | B2 | 4/2011 | Chen et al. |
| 8,111,539 | B2 | 2/2012 | Fasoli et al. |
| 8,289,749 | B2 | 10/2012 | Chen et al. |

(Continued)

OTHER PUBLICATIONS

Cheung, Kin P., "Can TDDB continue to serve as reliability test method for advance gate dielectric?", International Conference on Integrated Circuit Design and Technology, May 17-20, 2004, pp. 345-348, 4 pages.

(Continued)

*Primary Examiner* — Gene Auduong
(74) *Attorney, Agent, or Firm* — Vierra Magen Marcus LLP

(57) ABSTRACT

FORMING reversible resistivity-switching elements is described herein. The FORMING voltage may be halted if the current through the memory cell reaches some reference current. The reference current may depend on how many groups of memory cells have been FORMED. This can help to increase the accuracy of determining when to halt the FORMING voltage. After the FORMING voltage is applied, a RESET voltage may be applied to those memory cells that have a resistance that is lower than a reference resistance to raise the resistance of those memory cells. By raising the resistance, the leakage current of these memory cells when other groups are programmed may be less. This, in turn, helps to prevent FORMING of the other groups from slowing down. A reason why this helps to prevent the slowdown is that the FORMING voltage may be kept near a desired level.

26 Claims, 17 Drawing Sheets

(56) References Cited

U.S. PATENT DOCUMENTS

| | | |
|---|---|---|
| 8,355,271 B2 | 1/2013 | Rabkin et al. |
| 8,391,047 B2 * | 3/2013 | Maejima et al. ............... 365/148 |
| 8,422,269 B2 * | 4/2013 | Sasaki et al. ................. 365/148 |
| 2009/0003035 A1 | 1/2009 | Philipp |
| 2010/0067281 A1 | 3/2010 | Xi et al. |
| 2010/0232208 A1 | 9/2010 | Maejima |
| 2010/0232209 A1 | 9/2010 | Kawabata |
| 2011/0110144 A1 | 5/2011 | Kawai et al. |
| 2011/0235394 A1 | 9/2011 | Sasaki |
| 2011/0280059 A1 | 11/2011 | Xiao et al. |

OTHER PUBLICATIONS

Sawa, Akihito, "Resistive switching in transition metal oxides", Review, Materials Today, Jun. 2008, vol. 11, No. 6, Elsevier Publication, pp. 28-36, 9 pages.

International Search Report and Written Opinion for PCT/US2014/017840, Int'l Filing date Feb. 21, 2014, Report mailed May 2, 2014.

* cited by examiner

Fig. 3E
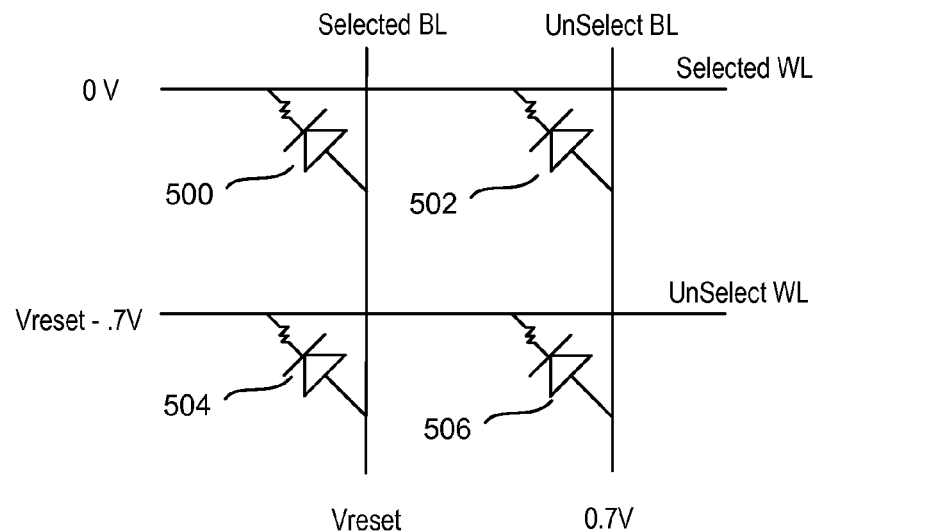
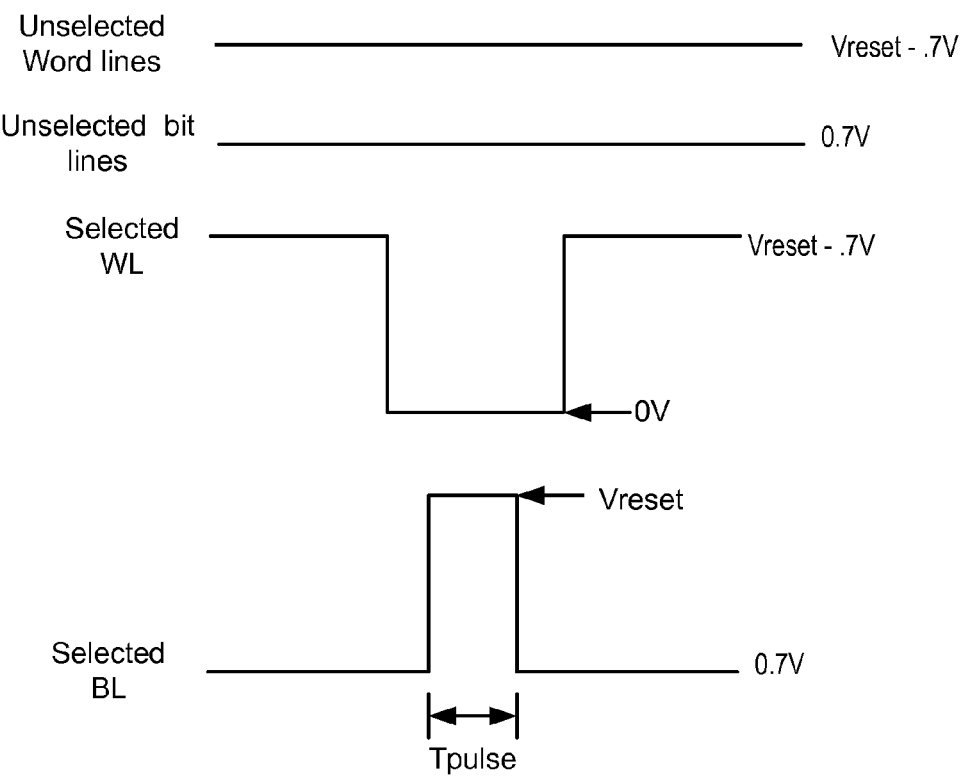
Fig. 3F

RERAM FORMING WITH RESET AND ILOAD COMPENSATION

BACKGROUND

This application relates to technology for non-volatile data storage having reversible resistivity-switching behavior.

A variety of materials show reversible resistivity-switching behavior, and as such may be suitable as use for memory elements. One type of material having reversible resistivity-switching behavior is referred to as resistance change memory (ReRAM). Transition metal oxides have been proposed for ReRAM. Upon application of sufficient voltage, current, or other stimulus, the reversible resistivity-switching material switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times. The low resistance state is sometimes referred to as an "on" state. The high resistance state is sometimes referred to as an "off" state. For some switching materials, the initial state is low-resistance rather than high-resistance.

These switching materials are of interest for use in non-volatile memory arrays. One type of memory array is referred to as a cross-point array, which is a matrix of memory elements typically arranged along x-axes (e.g., word lines) and along y-axes (e.g., bit lines). A digital value may be stored as a memory resistance (high or low). The memory state of a memory cell can be read by supplying appropriate voltages to the bit line and word line connected to the selected memory element. The resistance or memory state can be read as an output voltage or current of the bit line connected to the selected memory cell. One resistance state may correspond to a data "0," for example, while the other resistance state corresponds to a data "1." Some switching materials may have more than two stable resistance states.

Non-volatile memories formed from reversible resistivity-switching elements are known. For example, U.S. Patent Application Publication 2006/0250836, filed May 9, 2005 and titled "REWRITEABLE MEMORY CELL COMPRISING A DIODE AND A RESISTIVITY-SWITCHING MATERIAL," which is hereby incorporated by reference herein in its entirety, describes a rewriteable non-volatile memory cell that includes a diode coupled in series with a reversible resistivity-switching material such as a metal oxide or metal nitride. The diode serves as a "steering element" to control which memory cells are programmed (e.g., SET or RESET) and read.

Two proposed modes of switching the memory cells between SET and RESET are unipolar and bipolar switching. In bipolar switching, the low resistance state is established by applying a voltage having one polarity and the high resistance state is established by applying a voltage having the opposite polarity. In unipolar switching, switching between the low resistance state and high resistance state is accomplished by applying voltages of the same polarity, although perhaps different magnitudes. For example, unipolar switching may depend on the amplitude of the applied voltage, but not the polarity. Note that with bipolar switching both the polarity and amplitude of the voltage may be different.

One theory that is used to explain the switching mechanism is that one or more conductive filaments are formed by the application of a voltage to the memory cell. The conductive filaments lower the resistance of the memory cell. Application of another voltage may rupture the conductive filaments, thereby increasing the resistance of the memory cell. Application of still another voltage may repair the rupture in the conductive filaments, thereby decreasing the resistance of the memory cell once again. Other theories may be used to explain the switching mechanism.

The reversible resistivity-switching element may be in the high resistance state when it is first manufactured. This may be referred to as the "virgin state." The term "FORMING" is sometimes used to describe putting the reversible resistivity-switching element into a lower resistance state for the first time. Thus, the initial formation of the conductive filaments is sometimes referred to as "FORMING." The rupture of the filaments is sometimes referred to as RESETTING. The repair of the rupture of the filaments is sometimes referred to as SETTING. As noted, other theories may be used to explain FORMING, RESETTING, and SETTING.

The process of FORMING the reversible resistivity-switching element may be performed in a factory after the memory device is manufactured. Some FORMING techniques take a very long time to complete. It can take so long to FORM all of the memory cells in a memory device, that the commercial viability of the FORMING technique is suspect.

Some FORMING techniques are faster, but have problems with yield. The yield refers to how many of the memory cells in the device are properly FORMED such that they can be used during normal operation. If the yield is too low, again the commercial viability of the FORMING technique is suspect.

There are at least two parameters that may be used to control the FORMING of memory cells. A first is the time duration of the FORMING signal; another is the magnitude of the FORMING signal. If a voltage pulse is used as the FORMING signal, the voltage magnitude and the pulse duration can be selected for desired effects. One possible technique is to use a relatively long duration pulse at a lower magnitude. For example, the pulse could be about 1 ms ($1.0 \times 10^{-3}$ seconds) and the magnitude could be around 3V to 5V. This technique may provide for good control over the resistance distribution of the memory cells after they are FORMED. However, this technique may take considerable time to FORM all of the memory cells.

Another possible technique is to use a relatively short voltage pulse having a higher magnitude voltage. For example, the pulse could be microseconds or tens of microseconds (e.g., $10 \times 10^{-6}$ seconds) and the magnitude could be about 8V to 9V. This technique may speed up the FORMING process considerably compared to the long pulse, low magnitude technique. However, it can be difficult to control the resistance distribution with this technique.

Note that switching behavior might be explained by other theories than those above. Thus, any of the reversible resistivity-switching elements described herein are not limited to the theories for switching behavior described herein.

BRIEF DESCRIPTION OF THE DRAWINGS

FIG. 3E shows one embodiment of voltage applied to bit lines and word lines when RESETTING a memory cell.

FIG. 3F depicts waveforms that are applied to bit lines and word lines during a RESETTING process.

DETAILED DESCRIPTION

Figure 1A:
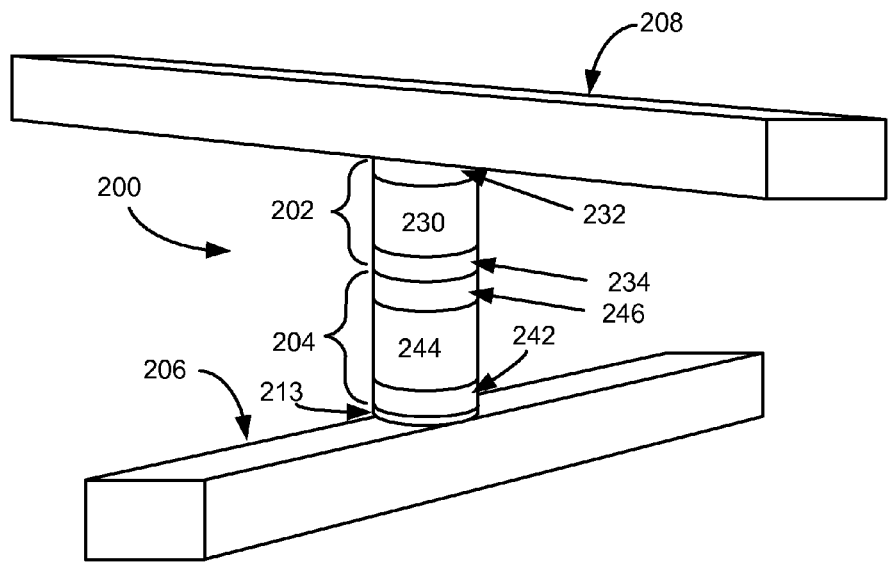
FIG. 1A is a simplified perspective view of one embodiment of a memory cell with a steering element.

A method and system for FORMING reversible resistivity-switching elements is described herein. FORMING refers to reducing the resistance of the reversible resistivity-switching element, and is generally understood to refer to reducing the resistance for the first time. For example, FORMING may refer to reducing the resistance of a virgin reversible resistivity-switching element.

FORMING techniques described herein are able to FORM the memory cells quickly, while still providing for a high yield. Therefore, the commercial viability of FORMING techniques is better than some conventional techniques.

Techniques disclosed herein prevent or reduce the slowing down of the FORMING process that could otherwise occur as additional groups of memory cells are FORMED. In some embodiments, the FORMING of memory cells proceeds group by group. Each group of memory cells may be associated with a word line (or other conductor). Thus, the FORMING can proceed from word line to word line. In some conventional techniques the FORMING process slows down as more word lines have their respective memory cells FORMED. That is, it may take additional FORMING pulses to complete the FORMING of a given memory cell.

A problem that may occur in some conventional FORMING techniques is that as FORMING progresses from one group of memory cells to the next, the FORMING process becomes less effective. What can happen is that the resistance of memory cells after FORMING can have an extremely wide distribution. This may be a more severe problem when a short duration pulse is used, but could possibly happen with a longer duration pulse. Memory cells that have a very low resistance can suffer from a high leakage current while memory cells in other groups are being FORMED. This high leakage current can make it more difficult for a bit line driver to provide the FORMING voltage, which can drop the effective FORMING voltage. This may be especially so for techniques that use a short duration FORMING pulse. Therefore, this slows down the FORMING process for groups that are FORMED later. This is discussed in more detail below, after an example architecture is discussed.

One possible way to tighten the resistance distribution is to test the memory cell's current while the FORMING voltage is being applied, and cut off the FORMING voltage if current rises to some threshold current. However, this technique may become less effective as more groups of memory cells are FORMED. As noted, as later word lines have their memory cells FORMED, the leakage current can increase. This increase in leakage current can interfere with the accuracy of testing when to cut off the FORMING voltage. This is discussed in more detail below, after an example architecture is discussed.

One embodiment is a method for FORMING a group of reversible resistivity-switching element in which after a FORMING voltage is applied, a RESET voltage is applied to those memory cells that have a resistance that is lower than a reference resistance. This raises the resistance of those memory cells. By raising the resistance, the leakage current of those memory cells when other groups are programmed may be less. This, in turn, helps to prevent FORMING of the other groups from slowing down. A reason why this helps to prevent the slowdown is that the FORMING voltage may be kept near a desired level.

One embodiment is a method in which the FORMING voltage is halted if the current through the memory cell reaches some reference current level. The reference current level may depend on how many groups of memory cells have been FORMED. For example, the reference current level may be based on how many word lines have had their respective memory cells FORMED. This can help to increase the accuracy of determining when to halt the FORMING voltage. Note that if the FORMING voltage were to be cut off too soon, the memory cell's resistance might not actually drop to the target resistance. Therefore, the FORMING process could have low yield. Thus, embodiments that adjust the reference current based on how many groups of memory cells have been FORMED prevents the yield loss due to FORMING voltage being cut off too soon.

Some embodiments combine the technique of RESETTING memory cells whose resistance is below a reference resistance with halting the applying of the FORMING voltage based on comparing memory cell current while applying the FORMING voltage to a reference current that depends on how many word lines have had their respective memory cells FORMED.

Memory Cell and System

Prior to discussing further details of FORMING a memory cell, an example memory cell and system will be discussed. FIG. 1A is a simplified perspective view of one embodiment of a memory cell 200 between two conductors 206, 208. The memory cell 200 includes a memory element 202 coupled in series with a steering element 204 between a first conductor 206 and a second conductor 208. In some embodiments, the steering element 204 is a diode. In one embodiment, the diode steering element 204 is a p-i-n diode. In one embodiment, a p-i-n diode includes a p-doped region, an intrinsic region, and an n-doped region. In one embodiment, the diode steering element 204 is a punch-thru diode. A punch-thru diode used as a steering element may be may be a N+/P−/N+ device or a P+/N−/P+ device. In one embodiment, the diode steering element 204 is a Schottky diode. In one embodiment, the diode steering element 204 is a back-to-back Schottky diode. In some embodiments, diode 204 may be formed from a polycrystalline semiconductor material such as polysilicon, germanium, or another semiconductor. Also, the diode steering element 204 may comprise more than one type of semiconductor. For example, diode 204 may be formed from a polycrystalline silicon-germanium alloy, polygermanium or any other suitable combination of semiconductors. In some embodiments, each region 242, 244, 246 of the diode steering element 204 is formed from the same material (but doped differently). However, it is not required that each region be formed from the same material. For example, a heterostructure may be possible.

However, the steering element 204 is not limited to being a diode. In one embodiment, the steering element 204 is a transistor. For example, a Field Effect Transistor (FET) can be used for the steering element 204. FIG. 1E, which will be discussed later, depicts a schematic of a part of a memory array in which the steering element 204 is an FET.

The memory cell 200 has a memory element 202 that includes a reversible resistivity-switching material 230, an upper electrode 232, and a lower electrode 234. Electrode 232 is positioned between reversible resistivity-switching material 230 and conductor 208. In one embodiment, electrode 232 is made of TiN. Electrode 234 is positioned between reversible resistivity-switching material 230 and steering element 204. In one embodiment, electrode 234 is made of TiN.

The memory cell 200 has an electrode 213 at the bottom of the memory cell 200 to facilitate electrical contact between the steering element 204 and other circuit elements. In one embodiment, electrode 213 is formed from TiN. Note that the relative positions of the steering element 204 and the memory element 202 could be reversed. For example, the steering element 204 could be above the memory element 202.

Memory element 202 includes reversible resistivity-switching material 230 having a resistance that may be reversibly switched between two or more states. For example, the reversible resistivity-switching material may be in an initial high-resistance state upon fabrication that is switchable to a low-resistance state upon application of a first physical signal. For example, the reversible resistivity-switching element 230 and/or memory element 202 may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistivity-switching materials are described, for example, in U.S. Patent Application Publication 2006/0250836, previously incorporated.

In some embodiments, reversible resistivity-switching material 230 may be formed from a metal oxide. Various different metal oxides can be used. The metal-oxide may a transition metal-oxide. Examples of metal-oxides include, but are not limited to, NiO, $Nb_2O_5$, $TiO_2$, $HfO_2$, $Al_2O_3$, $MgO_x$, $CrO_2$, VO, BN, and AlN. In one embodiment, the memory element electrodes 232, 234 are formed from TiN. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 1A, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication. The conductors 206, 208 may be referred to herein as word lines and bit lines. Typically, one of the conductors is a bit line and the other is a word line. Either conductor 206 or conductor 208 could be the word line. Likewise, either conductor 208 or conductor 206 could be the bit line.

While the memory element 202 is shown as being positioned above the steering element 204 in FIG. 1A, it will be understood that in alternative embodiments, the memory element 202 may be positioned below the steering element 204.

Figure 1B:
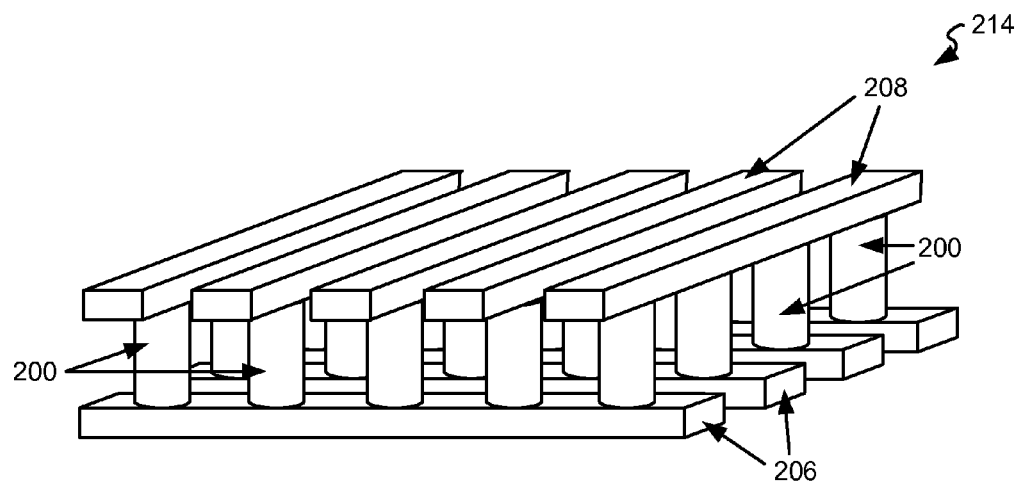
FIG. 1B is a simplified perspective view of a portion of a first memory level formed from a plurality of the memory cells of FIG. 1A.

FIG. 1B is a simplified perspective view of a portion of a first memory level 214 formed from a plurality of the memory cells 200 of FIG. 1A. For simplicity, the memory element 202 and the steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 1C:
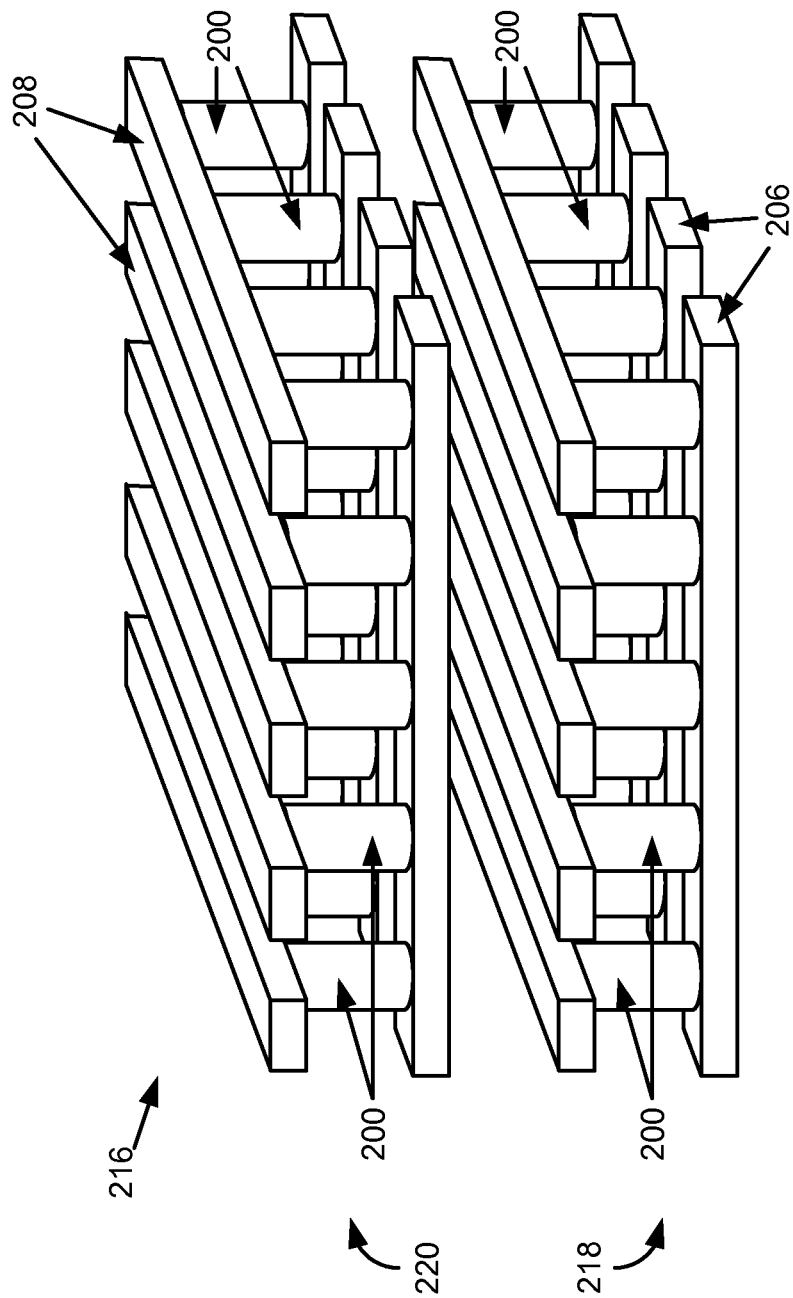
FIG. 1C is a simplified perspective view of a portion of a three dimensional memory array.

FIG. 1C is a simplified perspective view of a portion of a monolithic three dimensional array 216 that includes a first memory level 218 positioned below a second memory level 220. In the embodiment of FIG. 1C, each memory level 218 and 220 includes a plurality of memory cells 200 in a cross-point array. It will be understood that additional layers (e.g., an inter-level dielectric) may be present between the first and second memory levels 218 and 220, but are not shown in FIG. 1C for simplicity. Other memory array configurations may be used, as may additional levels of memory.

Figure 1D:
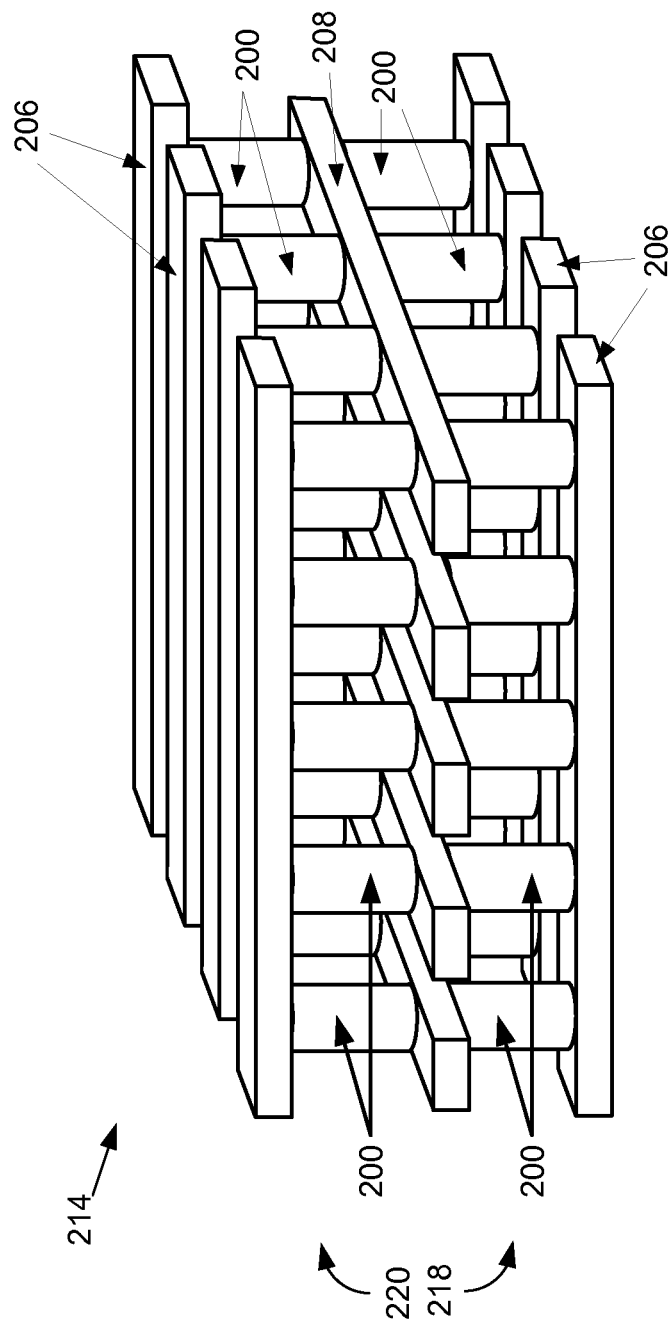
FIG. 1D is a simplified perspective view of a portion of a three dimensional memory array.
Figure 1E:
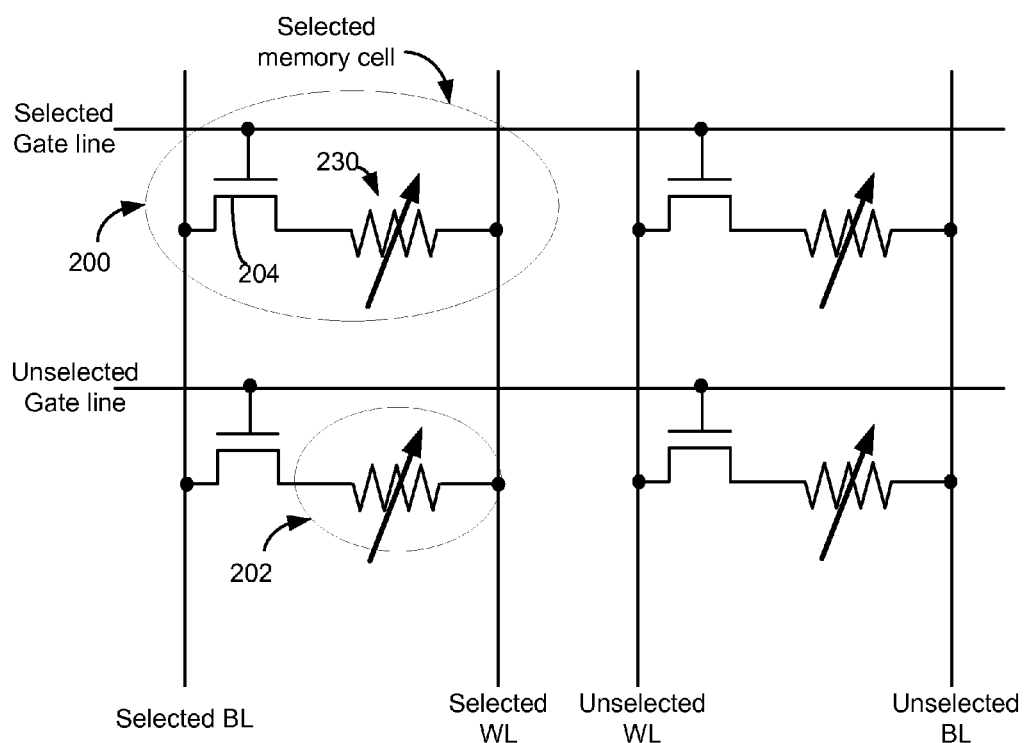
FIG. 1E depicts one embodiment of a portion of a memory array that uses FETs as steering elements.

In some embodiments, the memory levels may be formed (or fabricated) as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 1D.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 1A-1D show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. Nos. 6,952,043; 6,951,780; 6,034,882; 6,420,215; 6,525,953;and 7,081,377.

As previously mentioned, the steering element 204 is not required to be a diode. FIG. 1E depicts one embodiment of a schematic of a portion of a memory array that uses FETs as steering elements 204. Each memory cell 200 includes a memory element 202 having a reversible resistivity-switching element 230 and a steering element 204, which as stated is an FET. Each memory cell 200 resides between a bit line and a word line. The selected memory cell 200 resides between a selected word line and a selected bit line. The FET of the selected memory cell 200 is connected to the selected gate line. The voltage that is applied to the selected gate line controls the current that is allowed to flow through the reversible resistivity-switching element 230. For example, the gate voltage may be selected to limit the current through the reversible resistivity-switching element 230 to a desired level.

Figure 2:
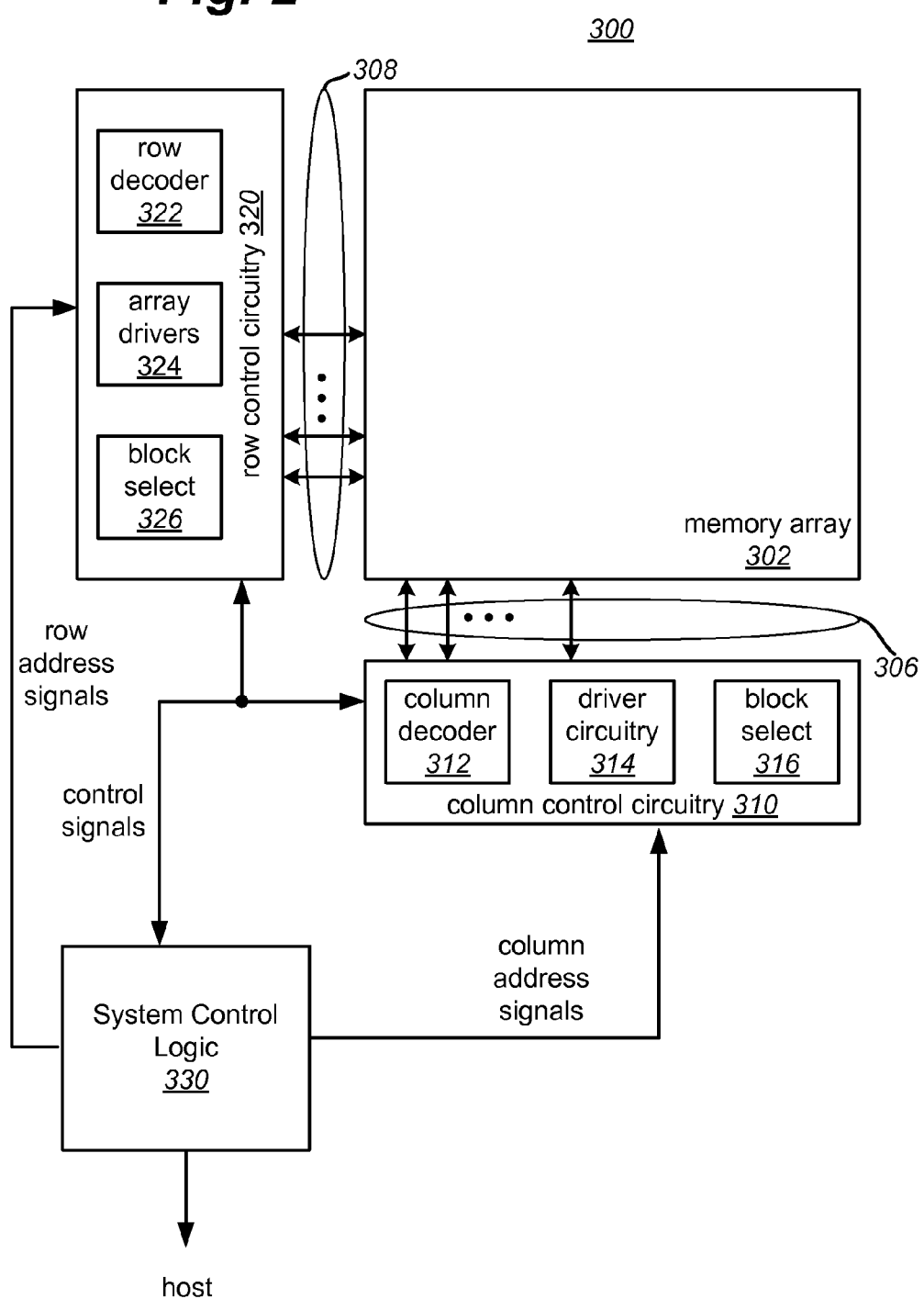
FIG. 2 is a block diagram of one embodiment of a memory system.

FIG. 2 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. In one embodiment column decoder 312 is a reversible polarity decoder circuit. In one embodiment row decoder 322 is a reversible polarity decoder circuit. In one embodiment, a reversible polarity decoder circuit has active low output in one mode and active high output in another mode. Further details of reversible polarity decoder circuits are described in U.S. Pat. No. 7,542,370, filed on Dec. 31, 2006, which is hereby incorporated herein in its entirety.

System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be further grouped together into bays that contain, for example, 16, 32, or a different number of blocks. Each block in a 3-D memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one end of the bit lines and other drivers on the other end of the bit lines.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

In one embodiment, all of the components depicted in FIG. 2 are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302.

The system control logic 330, the row control circuitry 320, and the column control circuitry 310 may be referred to herein as one or more managing circuits.

Figure 3A:
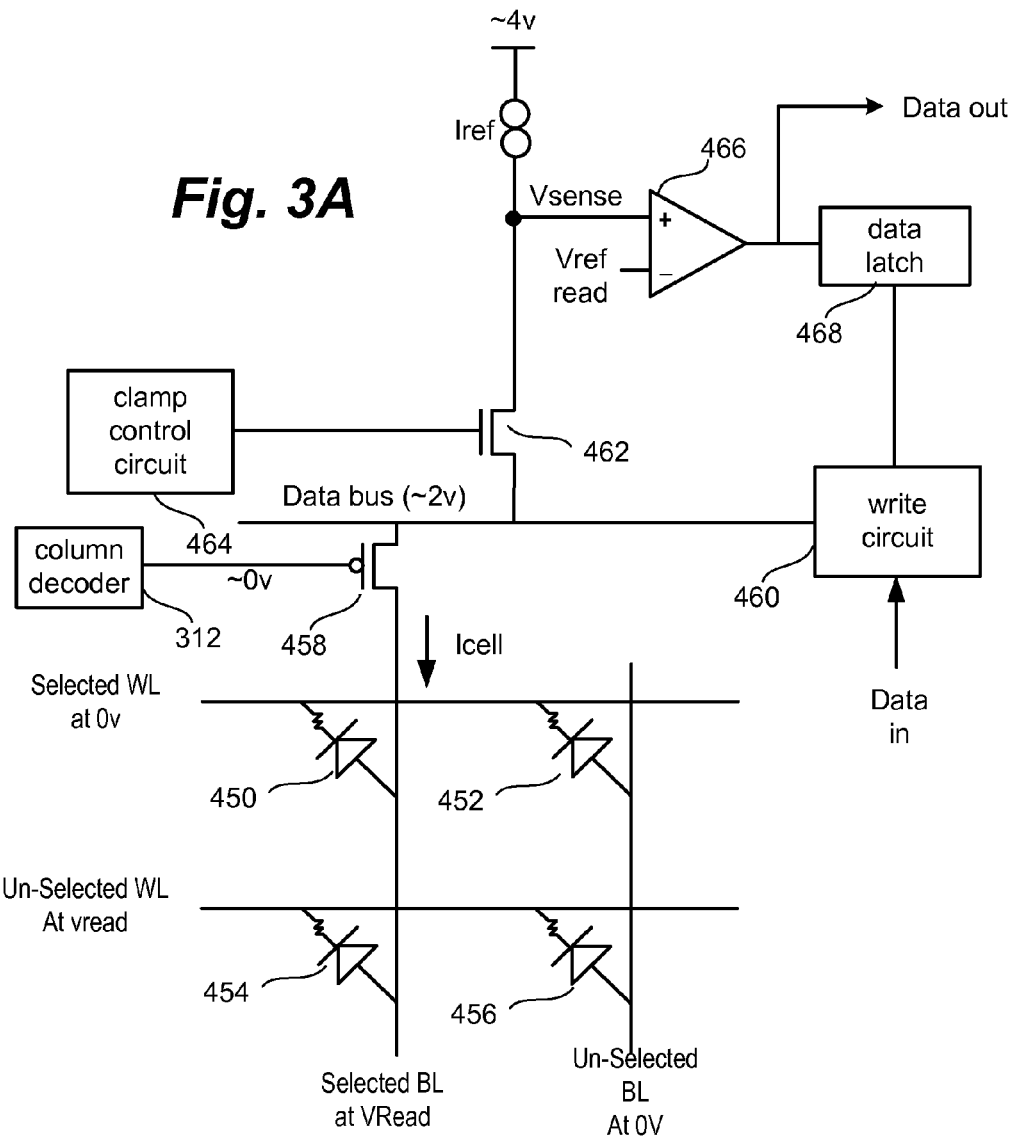
FIG. 3A depicts a circuit that can read the state of a memory cell.

FIG. 3A depicts a circuit that illustrates one embodiment for reading the state of a memory cell. To determine which state the memory element 202 is in, a voltage may be applied and the resulting current is measured. A higher measured current indicates that the memory element 202 is in the low-resistivity state. A lower measured current indicates that the memory element 202 is in the high-resistivity state. FIG. 3A shows a portion of a memory array including memory cells 450, 452, 454 and 456, which may be based on the embodiments of FIGS. 1A, 1B, 1C, and 1D. In this example, the steering element 204 is a diode. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

When attempting to read the state of the reversible resistivity-switching element, all word lines are first biased at Vread (e.g., approximately 2 volts) and all bit lines are at ground. The selected word line is then pulled to ground. For example purposes, this discussion will assume that memory cell 450 is selected for reading. One or more selected bit lines are pulled to Vread through the data bus (by turning on transistor 458) and the clamp device (transistor 462, which receives ~2 volts +Vt). The clamp device's gate is above Vread but controlled to keep the bit line near Vread. Current is pulled by the selected memory cell through transistor 462 from the $V_{SENSE}$ node. The $V_{SENSE}$ node also receives a reference current $I_{REF}$ that may be between a high-resistance state current and a low-resistance state current. The $V_{SENSE}$ node moves corresponding to the current difference between the cell current $I_{CELL}$ and the reference current $I_{REF}$. Comparator 466 generates a data out signal by comparing the $V_{SENSE}$ voltage to a Vref-read voltage. If the memory cell current $I_{CELL}$ is larger than $I_{REF}$, the memory cell is in the low-resistance state and the voltage at $V_{SENSE}$ will be lower than $V_{REF}$. If the memory cell current $I_{CELL}$ is smaller than $I_{REF}$, the memory cell is in the high-resistance state and the voltage at $V_{SENSE}$ will be higher than $V_{REF}$. The data out signal from comparator 466 is latched in data latch 468.

Figure 3B:
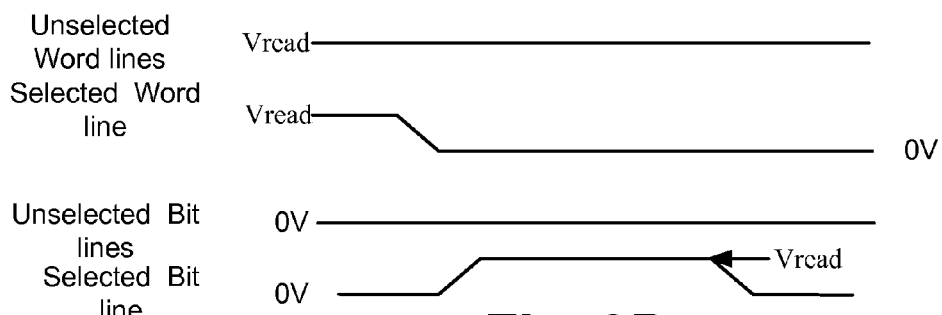
FIG. 3B depicts example waveforms applied to bit lines and word lines when READING a memory cell.

FIG. 3B depicts example waveforms applied to bit lines and word lines when READING a memory cell 200. These waveforms may be applied when using the circuit of FIG. 3A. Initially Vread (e.g., 2V) is applied to the word lines and the bit lines are grounded. Next, the voltage to selected word line is dropped from Vread to ground. Then, the voltage to selected bit line is raised from ground to Vread. This results in the bias scheme depicted in FIG. 3A. The selected bit line may be held at Vread for about 1 microsecond. The current of the selected bit line may be sensed by a circuit such as FIG. 3A. Then, the selected bit line is returned to ground.

Figures 3C, 3D:
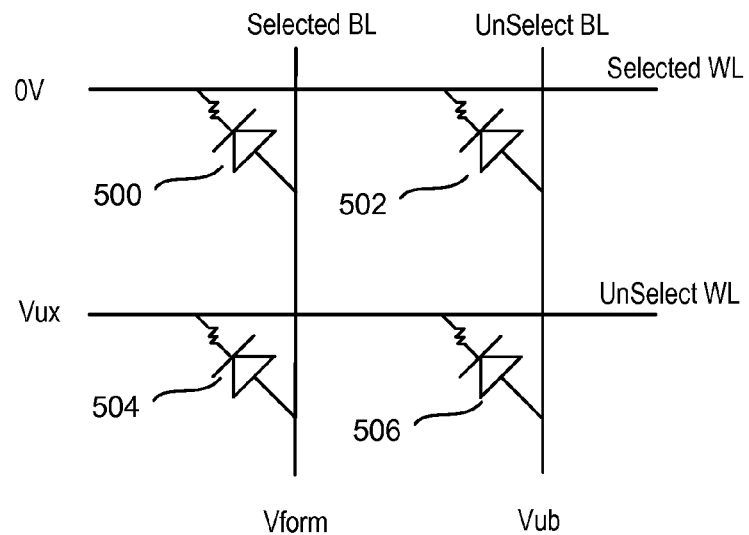
FIG. 3C shows one embodiment of voltage applied to bit lines and word lines when FORMING a memory cell.
FIG. 3D depicts waveforms that are applied to bit lines and word lines during a FORMING process.

FIG. 3C shows one embodiment of voltage applied to bit lines and word lines when FORMING a memory cell. This may be referred to as a "forward FORM" because the steering element is forward biased for the selected memory cell. However, embodiments are not limited to a forward FORM. Memory cell 500 is selected in this example. Memory cells 502, 504, and 506 are unselected. The voltage VFORM is applied to the selected BL. As an example, VFORM may be in the range of about 8V. However, VFORM could be higher or lower. In this example, 0V is applied to the selected word line. Therefore, about 8V may be applied across the selected memory cell 500.

The unselected word lines have Vux applied thereto. Vux may be about 0.7 to 0.8V less than VFORM. As one example, Vux is about 7.2V. The unselected bit lines have Vub applied thereto. Vub may be about 0.7V or so. In one embodiment, Vub is about 0.7V greater than the voltage applied to the unselected WL.

In some conventional techniques the bit line driver can have a difficult time providing the FORMING voltage. This may be more of a problem if many memory cells have been FORMED on a given bit line and those memory cells contribute a high leakage current due to their low resistance. Embodiments disclosed herein help the bit line driver to provide a consistent FORMING voltage as more and more memory cells are FORMED on a given bit line. In one embodiment, memory cells having a resistance that is below a threshold level is increased, such that their leakage current will be reduced when FORMING other memory cells.

FIG. 3D depicts waveforms that are applied to bit lines and word lines during a FORMING process. FIG. 3D depicts Vux initially applied to all word lines and Vub initially applied to all bit lines. The voltages on the unselected word lines and unselected bit lines may remain relatively constant after they are initially established. In one embodiment, the bias to the selected word line is changed from Vux to 0V and then the bias to the selected bit line is changed from Vub to VFORM in order to apply VFORM to the selected memory cell. After holding the selected bit line at VFORM for a time period "Tpulse," the voltage on the selected bit line is returned to Vub. The duration of Tpulse may be in the range of a few microseconds. However, Tpulse may have a greater or shorter duration.

In one embodiment, there is a detection circuit that determines when the memory cell's resistance drops to a reference resistance. At that point, the VFORM voltage may be returned to Vub. Therefore, the FORMING operation maybe halted. The detection circuit may sense a current flowing through the selected memory cell and trigger once the current rises to a reference current. In one embodiment, a circuit such as the one depicted in FIG. 3A may be used to detect the memory cell current as the FORMING voltage is applied. The "Data out" signal may be used as a signal to halt the FORMING voltage.

FIG. 3E shows one embodiment of voltage applied to bit lines and word lines when RESETTING a memory cell. This may be referred to as a "forward RESET" because the steering element is forward biased for the selected memory cell. However, embodiments are not limited to a forward RESET. Memory cell 500 is selected in this example. Memory cells 502, 504, and 506 are unselected. The voltage Vreset is applied to the selected BL. As an example, Vreset may be in the range from about 3.0V to about 5.0V. However, Vreset could be higher or lower. In this example, 0V is applied to the selected word line. Therefore, about 3.0V to about 5.0V may be applied across the selected memory cell 500. The unselected word lines have Vreset −0.7V applied thereto. The unselected bit lines have about 0.7V applied thereto.

FIG. 3F depicts waveforms that are applied to bit lines and word lines during a RESETTING process. FIG. 3F depicts Vreset −0.7V initially applied to all word lines and 0.7V initially applied to all bit lines. The voltages on the unselected word lines and unselected bit lines may remain relatively constant after they are initially established. In one embodiment, the bias to the selected word line is changed from Vreset −0.7V to 0V and then the bias to the selected bit line is changed from 0.7V to Vreset in order to apply Vreset to the selected memory cell. After holding the selected bit line at Vreset for a time period "Tpulse," the voltage on the selected bit line is returned to 0.7V. The duration of Tpulse may be in the range of a few milliseconds. However, Tpulse may have a greater or shorter duration.

Figure 4A:
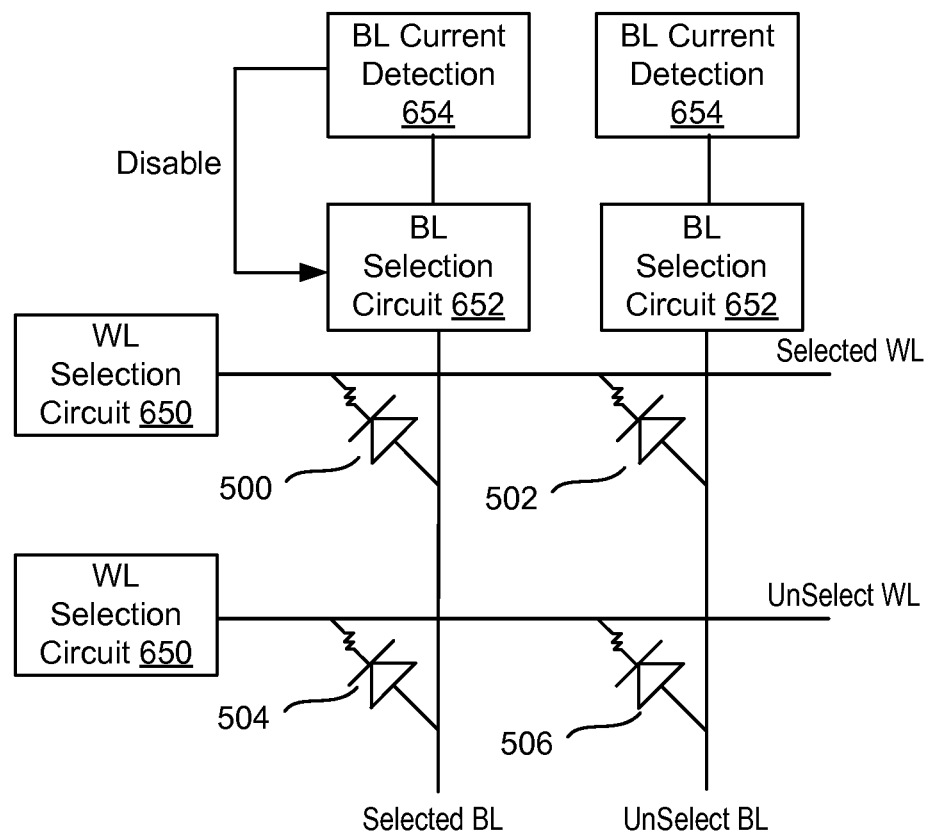
FIG. 4A shows four memory cells, each of which includes a diode and a reversible resistance-switching element.

FIG. 4A is a block diagram of a circuit having bit line current detection circuits 654 that can disable the selection of a bit line. The diagram also shows blocks for BL selection circuits 652 and WL selection circuits 650. The WL selection circuit 650 provides a suitable word line voltage. Depending on the operation, this may be the selected/unselected word line voltage for FORMING, SETTING, or RESETTING. The BL selection circuit 652 provides a suitable bit line voltage. Depending on the operation, this may be the selected/unselected voltage for FORMING, SETTING, or RESETTING.

FIG. 4A shows four memory cells 500, 502, 504 and 506, each of which includes a diode and a reversible resistance-switching element. In a full array, there would be many more than four memory cells. In one embodiment, the memory cells are based on the embodiment of FIG. 1A. Memory cell 500 is selected for setting, as it is at the intersection of the selected word line and the selected bit line.

A reason for the BL current detection 654 is to disable the select voltage while it is being applied to a selected memory cell. The BL current detection circuit 654 detects the BL current while the selected voltage is being applied. For example, while a FORMING voltage is being applied to the selected BL and to the selected WL, the BL selection current 654 samples a current from its associated selected BL. The BL selection circuit 654 may send feedback to the BL selection circuit 652 when the BL current reaches some level, such that the BL voltage may be changed from the select voltage to the unselect voltage. For example, while the FORMING voltage is being applied, the BL current detection 654 monitors the BL current. When the BL current reaches some reference level, the BL current detection 654 may send feedback to the BL selection circuit 652. In this example, a "Disable" signal is sent. In response, the BL selection circuit 652 changes the voltage it is applying from a select FORMING voltage to an unselect FORMING voltage. This prevents further FORMING of the memory cell.

Similarly, during a SET operation, the while the SET voltage is being applied by the BL selection circuit 652, the BL current detection 654 monitors the BL current. When the BL current reaches some reference level, the BL current detection 654 may send feedback to the BL selection circuit 652. In response, the BL selection circuit 652 changes the voltage it is applying from a select SET voltage to an unselect SET voltage. This prevents further SETTING of the memory cell.

In some embodiments, the BL current detection 654 has different circuitry for the different operations. For example, different circuitry might be used for RESET operations than for SET operations. The same or different circuitry may be used for FORM and SET operations.

Figure 4B:
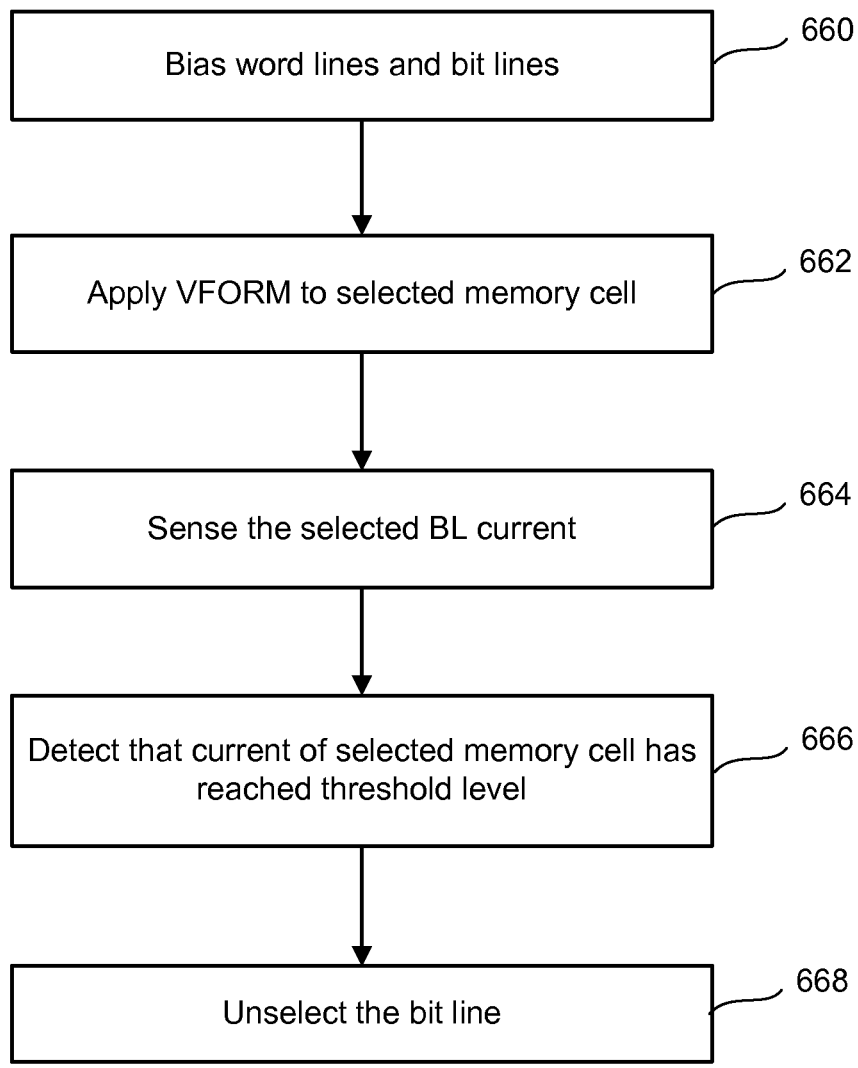
FIG. 4B is a flow chart describing one embodiment of halting a FORMING operation upon detecting that a current of a memory cell rises to a threshold current level.

FIG. 4B is a flow chart describing one embodiment of halting a FORMING operation upon detecting that a current of a memory cell rises to a threshold current level. In step 660, all word lines and all bit lines are biased at initial levels. FIG. 3F shows one example of initial levels.

In step 662, Vform is applied to the selected memory cell. FIG. 3F shows one example in which the selected word line voltage is dropped, and then the selected bit line voltage is increased. In one embodiment, appropriate select signals are applied to the WL selection circuit 650 to apply the selected word line voltage. In one embodiment, appropriate select signals are applied to the BL selection circuit 652 to apply the selected bit line voltage.

In step 664, the selected bit line current is sensed. In one embodiment, the BL current detection 654 senses the selected bit line current. In one embodiment, the comparator of FIG. 3A senses Vsense in order to effectively sense the selected bit line current. The current Iref may be established at a suitable level so that the comparator 466 will flip at the desired point.

In step 666, the BL current detection 654 detects that the memory cell current has risen to the threshold current level. For example, comparator 466 detects that VSENSE has risen to the Vref, thereby detecting the FORM operation.

In step 668, the bit line is unselected, such that the FORMING operation is halted. In step 668, the output of comparator 466 may be used to generate the disable signal. The disable signal may be applied to transistors in the BL selection circuit to change the bit line voltage from Vform to Vub (see FIG. 3D), in one embodiment.

In some embodiments, FORMING proceeds from one word line to the next. For example, a group of memory cells on one word line are FORMED. This could be performed in parallel. However, not necessarily all of the memory cells on the word line are FORMED in the same process. Next, another group of memory cells on that word line may be FORMED. Eventually, all memory cells on the word line are FORMED. However, note that some memory cells may fail to pass the FORMING process. Such memory cells may be flagged such that they are not used during normal operation.

After completing FORMING memory cells on one word line, the process may be repeated for the next word line. A potential problem that can occur with this process is that after FORMING some of the memory cells can have a very low resistance. This problem could occur with any type of FORMING signal, but could be more problematic with short duration, high magnitude voltage pulses. The foregoing means that some memory cells may have an unusually high leakage current when a memory cell on a later word line is FORMED. For example, referring back to FIG. 3C, after memory cells 500 and 502 are FORMED, memory cells 504 and 506 on the next word line may be FORMED. Note that although FIG. 3C shows just one memory cell being selected for FORMING, many memory cells on the same word line could be selected for FORMING at the same time by applying the FORMING voltages to the appropriate bit lines.

There may be considerable variation between the resistance of memory cell 500 and 502 after FORMING, with some conventional techniques. This can lead to significant differences in leakage current. Also, memory cells that having a lower resistance after FORMING can have larger leakage currents when memory cells on other word lines are being FORMED. Although not depicted in FIG. 3C, there may be many word lines. Thus, the leakage current due to already FORMED memory cells can be considerable. Also, the total amount of leakage current associated with already FORMED memory cells on a given word line may be somewhat unpredictable.

Further note that when the total leakage current increases it can be more difficult for the bit line driver to establish the FORMING voltage on the selected bit line. Referring to FIG. 3D, the FORMING voltage may be a relatively short pulse. Having a short pulse can be beneficial in that the total time it takes to FORM all of the memory cells can be reduced. However, it may be difficult for the bit line driver to establish the FORMING voltage on the selected bit line when the leakage current is high. As also noted, there may be some variance from bit line to bit line in how much actual leakage current is there. Thus, the driver on one bit line could have a harder time establishing the FORMING voltage than another bit line driver. Finally, when the FORMING voltage is lower, the time it takes to FORM the memory cells (e.g., the number of FORMING pulses) can increase. In view of the foregoing, the time it takes to FORM memory cells on word lines that are FORMED later can significantly increase with some conventional techniques. Moreover, there can be significant bit line to bit line variations in FORMING times with some conventional techniques.

One embodiment is a method for FORMING a group of reversible resistivity-switching element in which after a FORMING signal is applied, a voltage (e.g., RESET) is applied to those memory cells that have a resistance that is lower than a reference resistance. This raises the resistance of those memory cells. By raising the reference resistance, the leakage current of these memory cells when other groups are programmed may be less. This, in turn, helps to prevent FORMING of the other groups from slowing down. A reason why this helps to prevent the slowdown is that the FORMING voltage may be kept near a desired level. One possible reason why the FORMING voltage is kept near the desired level is because the bit line driver may be able to better establish the FORMING voltage on the selected bit line. However, there may be other reasons why the FORMING voltage is kept near the desired level.

Figure 5:
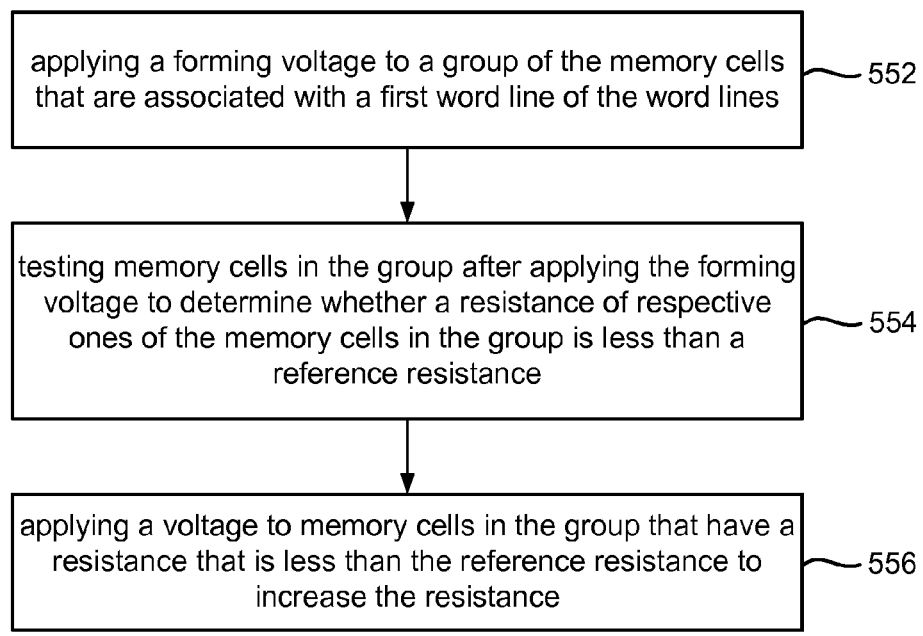
FIG. 5 depicts one embodiment of a process of operation of a memory array of memory cells having reversible resistivity-switching elements.

FIG. 5 depicts one embodiment of a process 550 of operation of a memory array of memory cells 200 having reversible resistivity-switching elements. In process 550, memory cells that show a low resistance after a FORMING voltage is applied have their resistance increase. In one embodiment, a RESET voltage is applied to increase the resistance.

Process 550 may be applied to a 3D memory array having a cross point configuration. Such an array may have nonvolatile memory cells associated with word lines and bit lines in a cross point array configuration. FIGS. 1C and 1E are two possible examples. The memory cells 200 may have steering elements 204. The steering element 204 could be, but is not limited to, a diode, a p-i-n diode, a punch-thru diode, a Schottky diode, a back-to-back Schottky diode, or an FET. Process 550 may be initiated when a memory cell 200 is initially to be changed from the high resistance state to the low resistance state. For example, process 550 may be applied to memory cells in the virgin state.

In step 552, a FORMING voltage is applied to a group of the memory cells that are associated with a first word line of the word lines. This may be a forward FORMING voltage. As noted herein, a forward FORMING voltage is one in which a steering element is forward biased. In one embodiment, FORMING voltages and timing such as depicted in FIG. 3C and 3D is used in step 552. In one embodiment, the duration of the FORMING voltage is on the order of microseconds or tens of microseconds. In one embodiment, the magnitude of the FORMING voltage is about 8V to 9V. However, the FORMING voltage could have a greater or lower magnitude.

In step 554, memory cells in the group are tested after applying the FORMING voltage to determine whether a resistance of respective ones of the memory cells in the group is less than a reference resistance. In one embodiment, step 554 is performed after FORMING the group of memory cells is completed. In one embodiment, step 554 is performed while FORMING the group of memory cells is still under-way. In one embodiment, read voltages and timing such as depicted in FIG. 3A and 3B is used in step 554.

In step 556, a voltage is applied to memory cells in the group that have a resistance that is less than the reference resistance to increase the resistance. In one embodiment, a RESET voltage is applied. In one embodiment, this is a forward RESET voltage. In one embodiment, RESET voltages and timing such as depicted in FIG. 3E and 3F is used in step 556. An example magnitude range for the voltage of step 556 is about 3V to 5V. However, a greater or lower magnitude voltage may be used. In one embodiment, the duration of the voltage is milliseconds. In one embodiment, the duration of the voltage is tens of milliseconds. However, the duration could be longer or shorter. In one embodiment, after applying the RESET pulse to the selected bit line, the RESET voltage is removed and the selected bit line is allowed to discharge through the selected memory cell. Step 556 will be applied to the same group of memory cells that went through the FORMING step.

In one embodiment, the memory cells are tested after applying the voltage in step 556 to determine how effective the voltage was at increasing the resistance. One or more additional voltages may be applied until the memory cell's resistance is at a suitable level.

After performing process 550 on the group on the first word line, the process could be repeated for another group on the first word line. After completing the process for all memory cells on the first word line, the process could be applied to another word line. This may be repeated until memory cells on all word lines are FORMED. Note that some memory cells that do not pass FORMING may be flagged so that they are not used during normal operation.

Figure 6A:
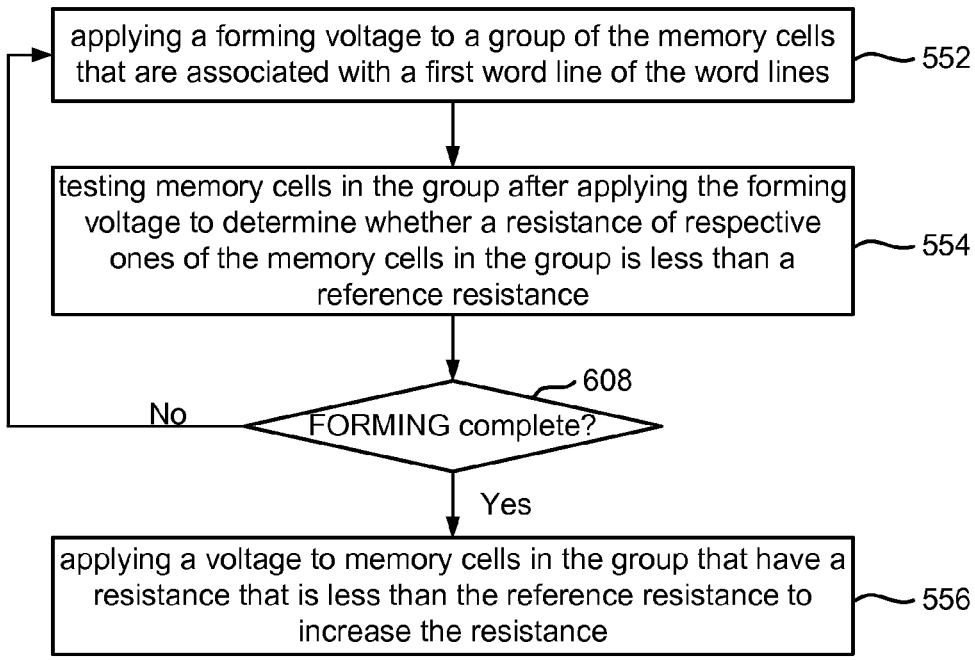
FIG. 6A is a flowchart of one embodiment of a process in which application of the voltage is after FORMING the group of memory cells is complete.

As noted, the application of the voltage of step 556 may be either after FORMING the group of memory cells is complete or during FORMING. FIG. 6A is a flowchart of one embodiment of a process in which application of the voltage is after FORMING the group of memory cells is complete. The process includes steps 552 and 554, which may be similar to steps of process 550. After step 554, a determination is made (step 608) whether FORMING of memory cells in the group is complete. If not, the process returns to step 552. After FORMING is complete, step 556 is performed to apply the voltage to increase the memory cell resistance. Step 556 is similar to the one of process 550.

Figure 6B:
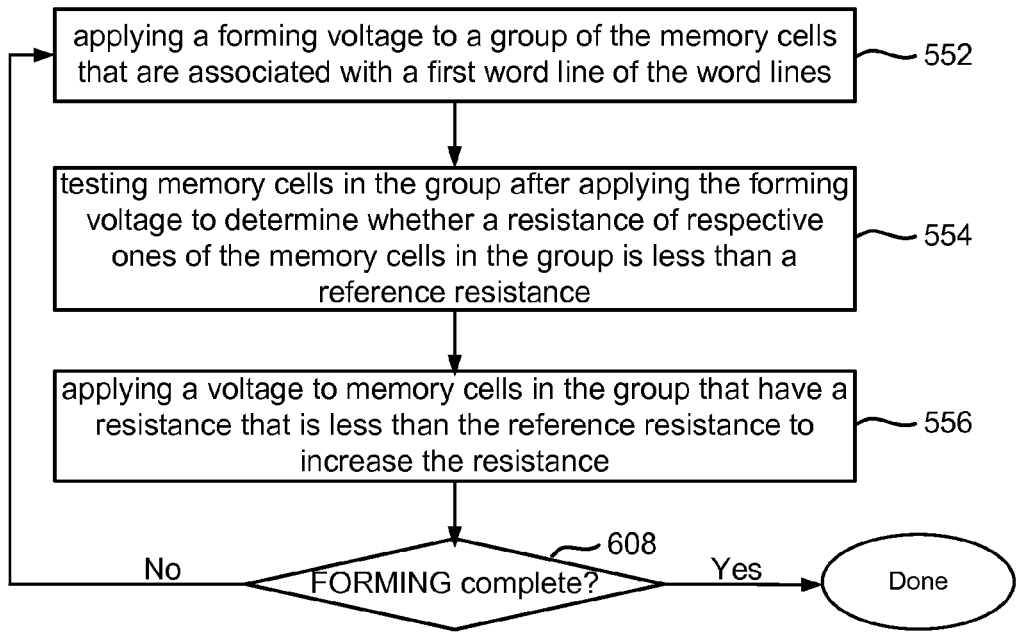
FIG. 6B is a flowchart of one embodiment of a process in which application of the voltage of step 556 of FIG. 5 is during the FORMING the group of memory cells.

FIG. 6B is a flowchart of one embodiment of a process in which application of the voltage of step 556 is during the FORMING the group of memory cells. The process includes steps 552, 554, and 556, which may be similar to steps of process 550. After step 556, a determination is made (step 608) whether FORMING of memory cells in the group is complete. If not, the process returns to step 552. The process continues until FORMING is complete.

Referring to FIG. 4A, the BL current detection 654 may be used to discontinue applying the FORMING voltage to a selected memory cell when its resistance lowers to some threshold level. In operation, this may be implemented by comparing the bit line current to some reference current. However, as more and more memory cells are FORMED on a given bit line, the leakage current associated with that bit line may increase. This increased leakage current may impact the bit line current. Thus, the leakage current could impact the accuracy of the BL current detection 654. One possibility is that the BL current detection 654 could trip too early.

One embodiment is a method in which the reference current level for halting the FORMING voltage depends on how many memory cells on the bit line have been FORMED. In one embodiment, the reference current is increased as more memory cells on a given bit line have their respective memory cells FORMED. This can help to improve the accuracy of the BL current detection 654. Another way to view this is to increase the reference current as more word lines have had their respective memory cells FORMED.

Figure 7:
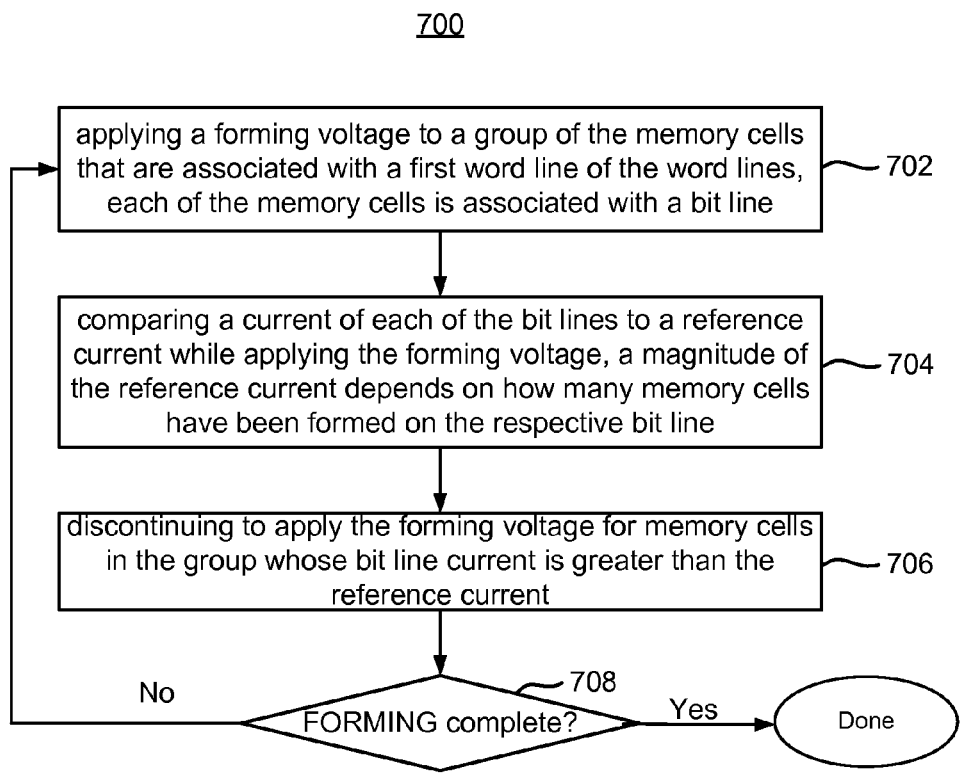
FIG. 7 depicts one embodiment of a process of operation of a memory array of memory cells having reversible resistivity-switching elements.

FIG. 7 depicts one embodiment of a process 700 of operation of a memory array of memory cells 200 having reversible resistivity-switching elements. The process may be used to discontinue applying a FORMING voltage based on a current of a selected memory cell. The memory cell current may be compared to a reference current. Moreover, the magnitude of the reference current may be based on how many memory cells have been FORMED on the selected bit line.

Process 700 may be applied to a 3D memory array having a cross point configuration. Such an array may have non-volatile memory cells associated with word lines and bit lines in a cross point array configuration. FIGS. 1C and 1E are two possible examples. The memory cells 200 may have steering elements 204. The steering element 204 could be, but is not limited to, a diode, a p-i-n diode, a punch-thru diode, a Schottky diode, a back-to-back Schottky diode, or an FET. Process 550 may be initiated when a memory cell 200 is initially to be changed from the high resistance state to the low resistance state. For example, process 700 may be applied to memory cells in the virgin state.

The memory cells 200 may have steering elements 204. The steering element 204 could be, but is not limited to, a diode, a p-i-n diode, a punch-thru diode, a Schottky diode, a back-to-back Schottky diode, or an FET. Process 700 may be initiated when a memory cell 200 is initially to be changed from the high resistance state to the low resistance state.

In step 702, a FORMING voltage is applied to a group of the memory cells that are associated with a given word line. In one embodiment, FORMING voltages and timing such as depicted in FIG. 3C and 3D is used in step 702. As noted herein, a forward FORMING voltage is one in which a steering element is forward biased. In one embodiment, FORMING voltages and timing such as depicted in FIG. 3C and 3D is used in step 552. In one embodiment, the duration of the FORMING voltage is on the order of microseconds or tens of microseconds. In one embodiment, the magnitude of the FORMING voltage is about 8V to 9V. However, the FORMING voltage could have a greater or lower magnitude.

In step 704, a current of each of the memory cells in the group is compared to a reference current while applying the FORMING voltage. The magnitude of the reference current may depend on how many memory cells have been FORMED on the selected bit line. In one embodiment, the magnitude of the reference current may depend on how many of the word lines have had their respective memory cells FORMED. In one embodiment, circuitry such as that of FIG. 3A or the block diagram of FIG. 4A is used to detect the current of the memory cells. Note that another way to consider step 704 is that the resistance of the memory cells is being compared to a reference resistance. Step 704 may determine whether the memory cell resistance drops to some threshold resistance that is associated with the memory cell being FORMED.

In one embodiment, more than one word line is selected for FORMING. In this case the reference current could be increased since more than one memory cell on a given bit line might be undergoing FORMING the same time. Thus, the magnitude of reference current used to detect the resistance drop can be dependent on the number of memory cells being FORMED on the same bit line. Step 706 includes discontinuing the applying of the FORMING voltage for memory cells in the group whose current is greater than the reference current. Steps 702-706 may be repeated (per check of step 708) until FORMING of the memory cells in the group is complete. After performing process 700 on the group on the first word line, the process could be repeated for another group on the first word line. After completing the process for all memory cells on the first word line, the process could be applied to another word line. This may be repeated until memory cells on all word lines are FORMED. Note that some memory cells that do not pass FORMING may be flagged so that they are not used during normal operation.

In one embodiment, halting the applying of the FORMING voltage using a reference current that depends on how many memory cells on a bit line have been FORMED is combined with applying a voltage to memory cells that have a low resistance to increase their resistance.

Figure 8A:
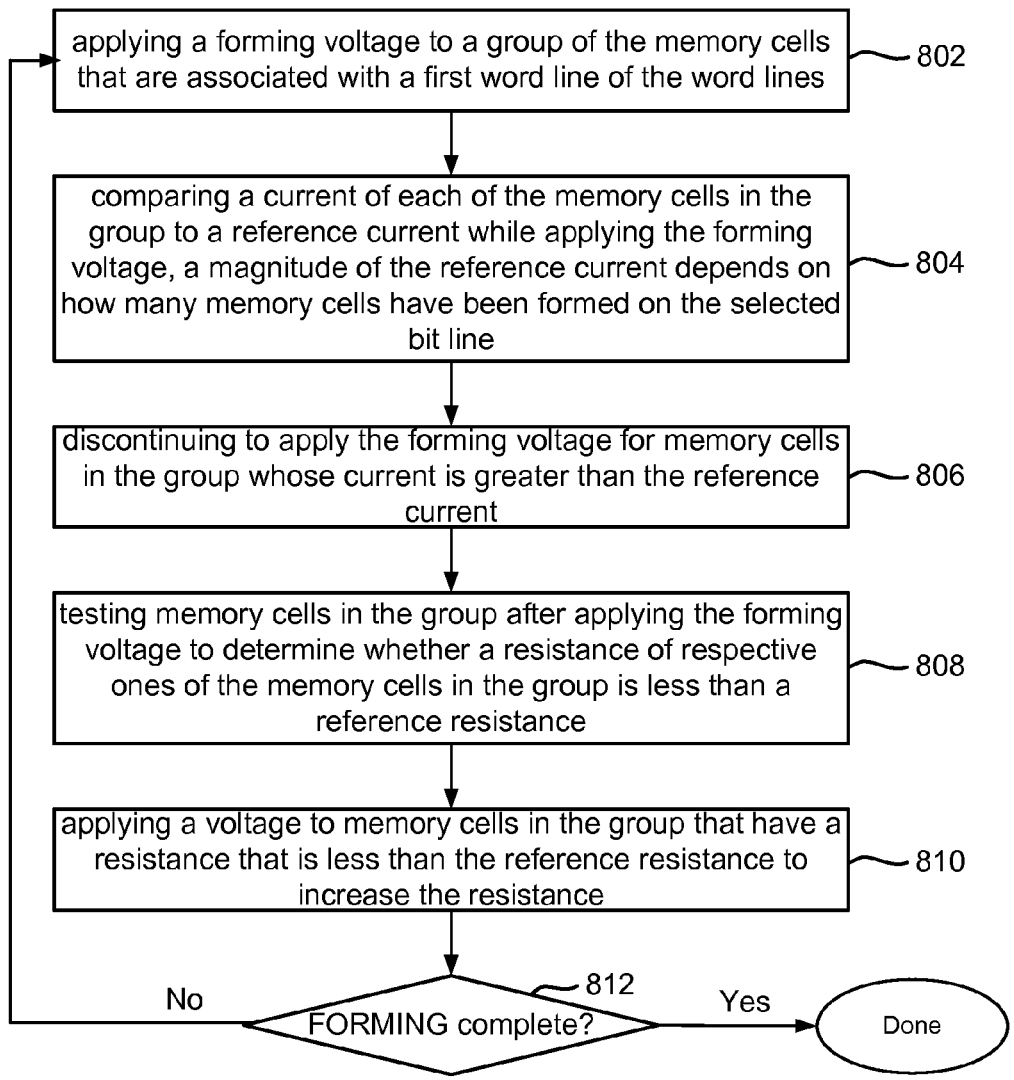
FIG. 8A is a flowchart of one embodiment of a process in which the voltage to increase the resistance of memory cells is applied prior to FORMING of the memory cells in the group being complete.

FIG. 8A is a flowchart of one embodiment of such a process. In the process of FIG. 8A, the voltage to increase the resistance is applied prior to FORMING of the memory cells in the group being complete. Steps 802-806 may be similar to steps 702-706 and will thus not be described in detail. In step 802, a forming voltage is applied to a group of the memory cells that are associated with a first word line of the word lines. In step 804, a current of each of the memory cells in the group while applying the forming voltage is compared to a reference current. A magnitude of the reference current depends on how many memory cells have been FORMED on the selected bit line. Step 806 is discontinuing to apply the FORMING voltage for memory cells in the group whose current is greater than the reference current.

Steps 808 and 810 may be similar to steps 554 and 556 of the process 550 and will thus not be described in detail. In step 808, memory cells in the group are tested after applying the forming voltage to determine whether a resistance of respective ones of the memory cells in the group is less than a reference resistance. In step 810, a voltage is applied to memory cells in the group that have a resistance that is less than the reference resistance to increase the resistance.

In step 812, a determination is made whether FORMING the memory cells in the group is complete. If so, the process ends. Otherwise, the process returns to step 802.

Figure 8B:
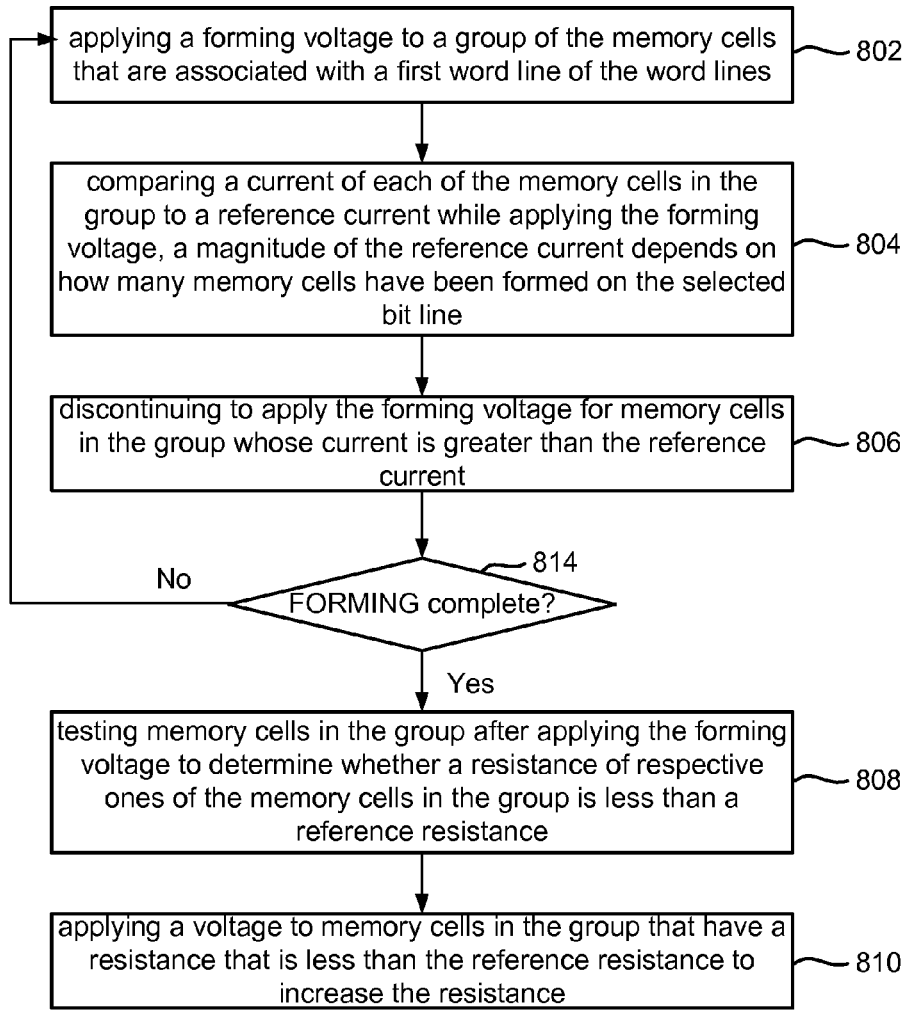
FIG. 8B is a flowchart of one embodiment of halting the applying of the FORMING voltage using a reference current that depends on how many memory cells on a bit line have been FORMED combined with applying a voltage to memory cells that have a low resistance to increase their resistance.

FIG. 8B is a flowchart of one embodiment of halting the applying of the FORMING voltage using a reference current that depends on how many memory cells on a bit line have been FORMED combined with applying a voltage to memory cells that have a low resistance to increase their resistance. In the process of FIG. 8B, the voltage to increase the resistance is applied after FORMING of the memory cells in the group is complete. Steps 802-806 may be similar to steps 702-706 and will thus not be described in detail. In step 802, a forming voltage is applied to a group of the memory cells that are associated with a first word line of the word lines. In step 804, a current of each of the memory cells in the group while applying the forming voltage is compared to a reference current. A magnitude of the reference current depends on how many memory cells have been FORMED on the selected bit line. Step 806 is discontinuing to apply the FORMING voltage for memory cells in the group whose current is greater than the reference current.

In step 814, a determination is made whether FORMING the memory cells in the group is complete. If not, the process returns to step 802. Otherwise, the process continues one to step 808. Steps 808 and 810 may be similar to steps 554 and 556 of the process 550 and will thus not be described in detail. In step 808, memory cells in the group are tested after applying the forming voltage to determine whether a resistance of respective ones of the memory cells in the group is less than a reference resistance. In step 810, a voltage is applied to memory cells in the group that have a resistance that is less than the reference resistance to increase the resistance. The process then concludes.

Figure 9:
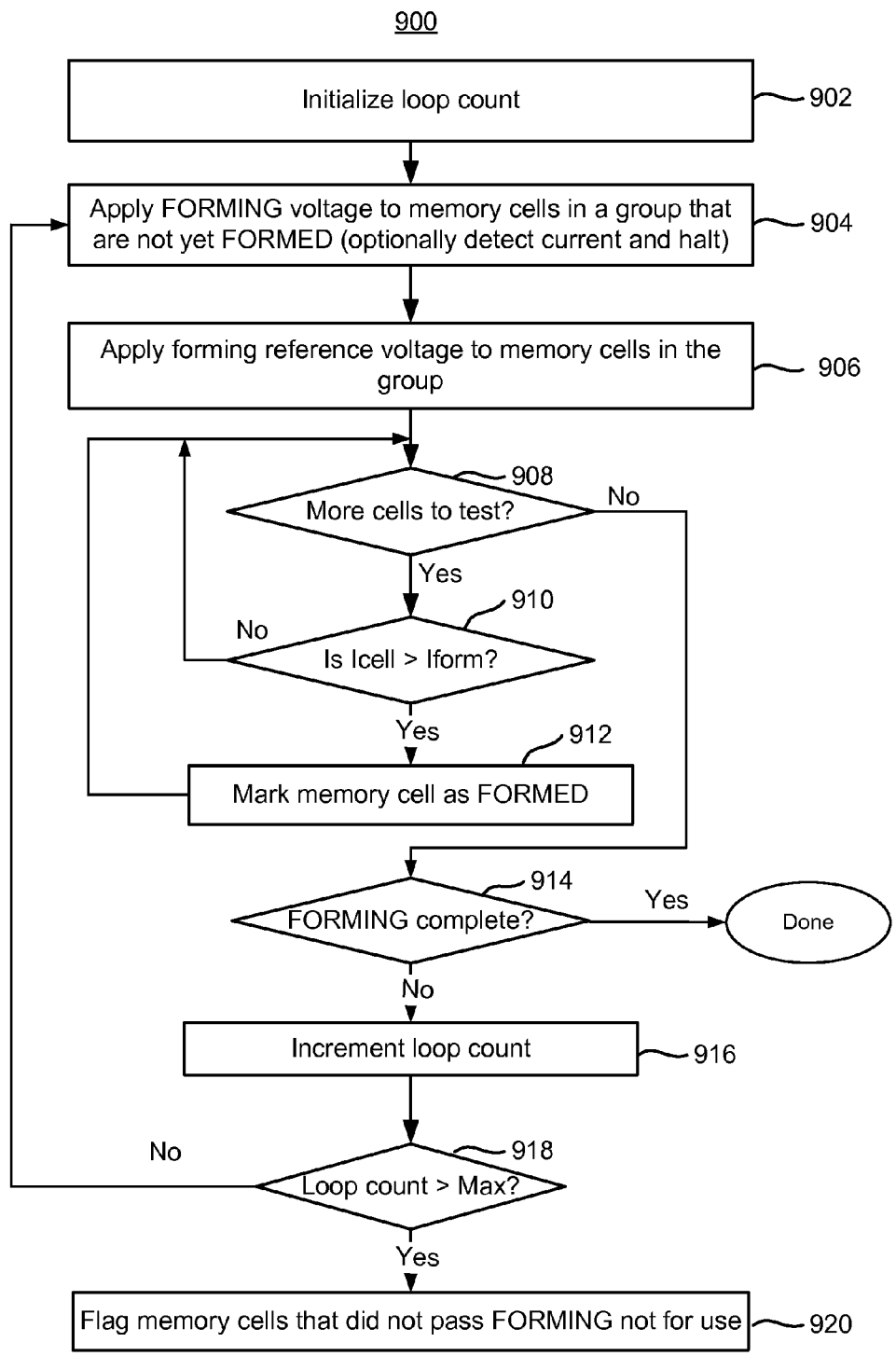
FIG. 9 is a flowchart illustrating one embodiment of a process 900 of FORMING a memory element.

FIG. 9 is a flowchart illustrating one embodiment of a process 900 of FORMING a memory element 202. Process 900 provides further details for embodiments disclosed herein. The process 900 may be applied to a group of memory cells. In one embodiment, the group of memory cells are associated with the same word line. The group could be any size. In step 902 a loop count is initialized to zero. The loop count is used to limit the number of times that FORMING is attempted. The maximum number of attempts may be established at any value including a single attempt.

In step 904, a "FORMING voltage" is applied to memory cell 200. For example, V_FORM may be applied to the selected bit line while the selected word line is grounded. An example range of the FORMING voltage is between about 8V to 9V. However, the FORMING voltage may be higher or lower.

In one embodiment, while applying the FORMING voltage the bit line current is tested and the FORMING voltage is halted if the current rising to some threshold voltage.

In step 906, a forming reference voltage is applied to the memory cells. This reference voltage may be applied after the FORMING voltage has been removed.

In steps 908-912, individual memory cells are tested to determine whether FORMING has passed. In step 908, it is determined whether there are more memory cells in the group to test. In step 910, current of the present memory cell is compared to a reference current to determine whether FORMING has passed for this individual memory cell. In step 912, it is noted whether the memory cells passed FORMING. The process then returns to step 908 to determine if there are more memory cells to test.

After all memory cells have been tested, in step 914, a determination is made whether any memory cells have not yet completed FORMING. If all memory cells successfully completed FORMING, then the process concludes.

If some memory cells have not yet passed FORMING (step 914 is no), then the loop count is incremented in step 916. If the loop count is not yet at the maximum (step 918 is no), then the process returns to step 904 to apply another FORMING voltage.

When the loop count reaches the maximum, those memory cells that have not yet passed FORMING may be flagged in step 920, so that they are not used.

Figure 10:
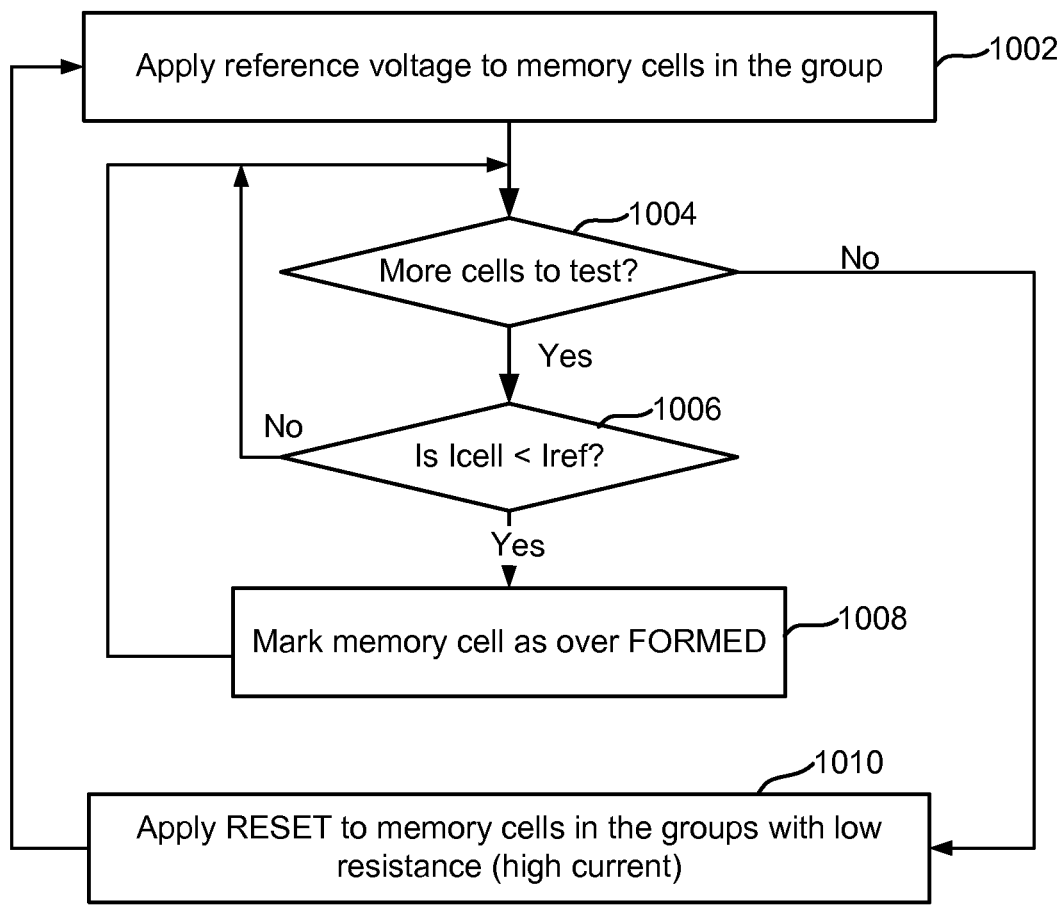
FIG. 10 is a flowchart of one embodiment that shows further details of applying a voltage to memory cells whose resistance is determined to be lower than a threshold after applying the FORMING voltage.

FIG. 10 is a flowchart of one embodiment that shows further details of applying a voltage to memory cells whose resistance is determined to be lower than a threshold after applying the FORMING voltage. In one embodiment, this process is performed after the process of Figure is complete. In one embodiment, this process is performed during the process of FIG. 9. For example, this process could be performed after step 908, or at some other location.

In step 1002, a reference voltage is applied to the memory cells in the group being FORMED, or having just been FORMED. In step 1004-1008 individual memory cells are tested. Step 1004 determines whether there are more memory cells in the group to be tested.

In step 1006, the current of the memory cell (e.g., bit line current) is compared to a reference current. The reference current is for establishing whether the memory cell resistance is lower than a threshold, given the reference voltage applied in step 1002. If the current is less than the reference, then the process returns to step 1004. If the current is greater than the reference, then the memory cell is marked as having been over FORMED. When all memory cells have been tested, the process goes to step 1010.

In step 1010 a RESET voltage is applied to memory cells in the group that were marked as over FORMED. Then, the process returns to step 1002 to apply the reference voltage to determine which memory cells might still have a resistance that is below the threshold resistance. If desires, a loop counter may be added to the process, similar to the process of FIG. 9, to escape. Note that memory cells that fail to have their resistance raised above the threshold resistance do not necessarily need to be flagged as having failed the FORMING process. Rather, such memory cells may still be considered to pass the FORMING process.

One embodiment includes a method of operating non-volatile storage having a plurality of word lines; each of the word lines is associated with a plurality of memory cells; each of the memory cells having a reversible resistivity-switching material. The method comprises applying a FORMING voltage to a group of the memory cells that are associated with a first word line of the word lines, testing memory cells in the group after applying the FORMING voltage to determine whether a resistance of respective ones of the memory cells in the group is less than a reference resistance, and applying a voltage to memory cells in the group that have a resistance that is less than the reference resistance to increase the resistance.

One embodiment includes a storage system, comprising a plurality of word lines a plurality of bit lines associated with the plurality of word lines, a plurality of non-volatile memory cells associated with the plurality of word lines and the plurality of bit lines in a cross point array configuration. Each of the non-volatile memory cells includes a reversible resistivity-switching material. The system also has one or more managing circuits in communication with the plurality of word lines and the plurality of bit lines. The one or more managing circuits apply a FORMING voltage to a group of the memory cells that are associated with a first word line of the word lines. The one or more managing circuits apply a reference voltage to memory cells in the group and determine whether a current of the memory cell in response to the reference voltage is greater than a reference current. The one or more managing circuits apply a voltage to memory cells in the group that have a current that is greater than the reference current to increase the resistance of respective ones of the memory cells.

One embodiment includes a method of operating non-volatile storage having a plurality of word lines and a plurality of bit lines; each of the word lines is associated with a plurality of memory cells; each of the memory cells having a memory element that includes a reversible resistivity-switching material; each of the memory cells is associated with one of the bit lines. The method comprise applying a FORMING voltage to a group of the memory cells that are associated with a first word line of the word lines, comparing a current of each of the bit lines to a reference current while applying the FORMING voltage. A magnitude of the reference current depends on how many memory cells have been FORMED on the respective bit line. The method also includes discontinuing to apply the FORMING voltage for memory cells in the group whose bit line current is greater than the reference current.

One embodiment includes a storage system, comprising a plurality of bit lines, a plurality of word lines, a plurality of non-volatile memory cells coupled between respective ones of the bit lines and the word lines in a cross-point array configuration, and one or more managing circuits in communication with the bit lines and the word lines. Each of the memory cells includes a steering element and a memory element having a reversible resistivity-switching memory element. The one or more managing circuits apply a FORMING voltage to a group of the memory cells that are associated with a first word line of the word lines. The one or more managing circuits compare a current of ones of the bit lines to a reference current while applying the FORMING voltage. A magnitude of the reference current depends on how many memory cells have been FORMED on the respective bit line. The one or more managing circuits discontinue to apply the FORMING voltage for memory cells in the group whose bit line current is greater than the reference current.

The foregoing detailed description has been presented for purposes of illustration and description. It is not intended to be exhaustive or be limited to the precise FORM disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method of operating non-volatile storage having a plurality of word lines, each of the word lines is associated with a plurality of memory cells, each of the memory cells having a reversible resistivity-switching material, the method comprising:
   applying a FORMING voltage to a group of the memory cells that are associated with a first word line of the word lines;
   testing memory cells in the group after applying the FORMING voltage to determine whether a resistance of respective ones of the memory cells in the group is less than a first reference resistance that is associated with being FORMED;
   repeating the applying the FORMING voltage and the testing memory cells for the first reference resistance until FORMING of the group of the memory cells is complete;
   testing memory cells in the group after applying the last FORMING voltage to determine whether a resistance of respective ones of the memory cells in the group is less than a second reference resistance that is associated with being over FORMED, wherein the second reference resistance is significantly below the first reference resistance; and
   applying a voltage to memory cells in the group that have a resistance that is less than the second reference resistance to increase the resistance.

2. The method of claim 1, wherein each of the plurality of memory cells is associated with a bit line, and further comprising:
   testing a bit line current of respective ones of the memory cells in the group while applying the FORMING voltage; and
   halting the applying of the FORMING voltage for memory cells for which the bit line current is greater than a reference current, a magnitude of the reference current depends on how many memory cells have been FORMED on the bit line being tested.

3. The method of claim 1, wherein the testing of the memory cells in the group to determine whether a resistance of the memory cell is less than a second reference resistance comprises:
   applying a reference voltage to memory cells in the group; and
   determining whether a current of the memory cell in response to the reference voltage is greater than a reference current.

4. The method of claim 1, further comprising:
   applying a RESET voltage to memory cells in the group that have a resistance that is less than the second reference resistance until substantially all of the memory cells in the group have a resistance that is greater than the second reference resistance.

5. The method of claim 1, further comprising:
   FORMING memory cells associated with other ones of the word lines, including:
   applying a FORMING voltage to memory cells that are associated with the word line for which memory cells are presently being FORMED;
   testing a current of respective ones of the memory cells presently being FORMED while applying the FORMING voltage; and
   halting the applying of the FORMING voltage for memory cells presently being FORMED for which the current is greater than a test current, a magnitude of the test current depends on how many of the word lines have had their respective memory cells FORMED.

6. The method of claim 1, wherein the applying a voltage to memory cells in the group that have a resistance that is less than the second reference resistance to increase the resistance is only performed after FORMING of the memory cells in the group is complete.

7. The method of claim 1, wherein the applying a voltage to memory cells in the group that have a resistance that is less than the second reference resistance to increase the resistance is performed prior to and after FORMING of the memory cells in the group is complete.

8. The method of claim 1, wherein the group of the memory cells have a resistance distribution after FORMING is complete, the applying a voltage to memory cells in the group that have a resistance that is less than the second reference resistance to increase the resistance tightens the resistance distribution of the group of the memory cells.

9. The method of claim 1, wherein a memory cell on a given bit line that has less than the second reference resistance has an unusually high leakage current when another memory cell on that bit line is FORMED afterwards.

10. A storage system, comprising:
    a plurality of word lines;
    a plurality of bit lines associated with the plurality of word lines;
    a plurality of non-volatile memory cells associated with the plurality of word lines and the plurality of bit lines in a cross point array configuration, each of the non-volatile memory cells including a reversible resistivity-switching material, the non-volatile memory cells arranged in multiple layers; and
    one or more managing circuits in communication with the plurality of word lines and the plurality of bit lines, the one or more managing circuits are configured to apply a FORMING voltage to a group of the memory cells that are associated with a first word line of the word lines, the one or more managing circuits are configured to test memory cells in the group after applying the FORMING voltage to determine whether a resistance of respective ones of the memory cells in the group is less than a reference resistance that is associated with being FORMED, the one or more managing circuits are configured to repeat the applying the FORMING voltage and the testing memory cells for the reference resistance until FORMING of the group of the memory cells is complete, the one or more managing circuits are configured to apply a reference voltage to memory cells in the group and determine whether a current of the memory cell in response to the reference voltage is greater than a reference current that is associated with being over FORMED, wherein an over FORMED memory cells has a resistance that is significantly below the reference resistance, the one or more managing circuits are configured to apply a voltage to memory cells in the group that have a current that is greater than the reference current to increase a resistance of respective ones of the memory cells.

11. The storage system of claim 10, wherein the one or more managing circuits are configured to apply the voltage to memory cells in the group only after FORMING of the memory cells in the group is complete.

12. The storage system of claim 10, wherein the one or more managing circuits are configured to apply the voltage to memory cells in the group prior to and after FORMING of the memory cells in the group being complete.

13. The storage system of claim 10, wherein the one or more managing circuits are configured to compare a bit line current of respective ones of the memory cells in the group to a test current while applying the FORMING voltage, the one or more managing circuits are configured to halt the applying of the FORMING voltage for memory cells for which the bit line current is greater than the test current, a magnitude of the test current depends on how many memory cells have been FORMED on the bit line being tested.

14. The storage system of claim 10, wherein the memory cell includes a steering element.

15. A method of operating non-volatile storage having a plurality of word lines and a plurality of bit lines, wherein each of the word lines is associated with a plurality of memory cells, each of the memory cells having a memory element that includes a reversible resistivity-switching material, wherein each of the memory cells is associated with one of the bit lines, the method comprising:
 applying a FORMING voltage to a group of the memory cells that are associated with a first word line of the word lines;
 comparing a current of each of the bit lines to a reference current while applying the FORMING voltage, wherein a magnitude of the reference current depends on how many memory cells have been FORMED on the respective bit line; and
 discontinuing to apply the FORMING voltage for memory cells in the group whose bit line current is greater than the reference current while continuing to apply the FORMING voltage for memory cells in the group whose bit line current is less than the reference current.

16. The method of claim 15, wherein the reference current is a first reference current, and further comprising:
 applying a reference voltage to memory cells in the group after applying the FORMING voltage and FORMING of the group of the memory cells is complete;
 comparing a current that results in respective ones of the memory cells in the group in response to the reference voltage to a second reference current; and
 applying a RESET voltage to memory cells in the group that have a current that is greater than the second reference current.

17. The method of claim 16, further comprising:
 applying the RESET voltage to memory cells in the group that have a current that is greater than the reference current until substantially all of the memory cells in the group have a current that is less than the second reference current.

18. The method of claim 17, wherein the memory cell includes a diode steering element in series with the reversible resistivity-switching material, the FORMING voltage forward biases the diode, the RESET voltage forward biases the diode.

19. The method of claim 15, further comprising:
 FORMING memory cells associated with other ones of the word lines, including:
 applying a FORMING voltage to memory cells that are associated with the word line for which memory cells are presently being FORMED;
 comparing a bit line current of respective ones of the memory cells presently being FORMED while applying the FORMING voltage to a test current, wherein a magnitude of the test current depends on how many of the word lines have had their respective memory cells FORMED; and
 halting the applying of the FORMING voltage for memory cells presently being FORMED for which the bit line current is greater than the test current.

20. The method of claim 19, wherein the magnitude of the test current is increased as a greater number of word lines have had their respective memory cells FORMED.

21. A storage system, comprising:
 a plurality of bit lines;
 a plurality of word lines;
 a plurality of non-volatile memory cells coupled between respective ones of the bit lines and the word lines in a cross-point array configuration, wherein each of the memory cells includes a steering element and a memory element having a reversible resistivity-switching memory element, wherein the non-volatile memory cells are arranged in multiple layers stacked on top of one another; and
 one or more managing circuits in communication with the bit lines and the word lines, the one or more managing circuits apply a FORMING voltage to a group of the memory cells that are associated with a first word line of the word lines, the one or more managing circuits compare a current of ones of the bit lines to a reference current while applying the FORMING voltage, wherein a magnitude of the reference current depends on how many memory cells have been FORMED on the respective bit line, the one or more managing circuits discontinue to apply the FORMING voltage for memory cells in the group whose bit line current is greater than the reference current and continue to apply the FORMING voltage for memory cells in the group whose bit line current is less than the reference current.

22. The storage system of claim 21, wherein the reference current is a first reference current, and wherein the one or more managing circuits apply a reference voltage to memory cells in the group after applying the FORMING voltage and forming of the group of memory cells is complete, the one or more managing circuits compare a current that results in respective ones of the memory cells in the group in response to the reference voltage to a second reference current, the one or more managing circuits apply a voltage to memory cells in the group that have a current that is greater than the second reference current to increase the resistance of the memory cells.

23. The storage system of claim 22, wherein the one or more managing circuits apply the voltage to memory cells in the group that have a current that is greater than the reference current until substantially all of the memory cells in the group have a current that is less than the second reference current.

24. The storage system of claim 21, wherein after FORMING the group of the memory cells that are associated with the first word line the one or more managing circuits FORM memory cells associated with other ones of the word lines.

25. The storage system of claim 24, wherein the one or more managing circuits increase a magnitude of the reference current that is compared to the bit line current while the FORMING voltage is applied as a greater number of word lines have had their respective memory cells FORMED.

26. The storage system of claim 21, wherein the steering element comprises a diode in series with the reversible resistivity-switching memory element, the FORMING voltage forward biases the diode.

* * * * *